(12) United States Patent
Vacanti et al.

(10) Patent No.: US 11,181,616 B2
(45) Date of Patent: Nov. 23, 2021

(54) SYNTHESIZER FOR RADAR SENSING

(71) Applicant: Honeywell International Inc., Charlotte, NC (US)

(72) Inventors: David C. Vacanti, Renton, WA (US); Marc M. Pos, Duvall, WA (US)

(73) Assignee: Honeywell International Inc., Charlotte, NC (US)

(*) Notice: Subject to any disclaimer, the term of this patent is extended or adjusted under 35 U.S.C. 154(b) by 0 days.

(21) Appl. No.: 17/033,577

(22) Filed: Sep. 25, 2020

(65) Prior Publication Data

US 2021/0025974 A1 Jan. 28, 2021

Related U.S. Application Data

(62) Division of application No. 15/703,817, filed on Sep. 13, 2017, now Pat. No. 10,830,873.

(Continued)

(51) Int. Cl.
*G01S 7/41* (2006.01)
*G01S 13/93* (2020.01)
(Continued)

(52) U.S. Cl.
CPC .............. *G01S 7/41* (2013.01); *G01S 7/032* (2013.01); *G01S 7/282* (2013.01); *G01S 7/292* (2013.01);
(Continued)

(58) Field of Classification Search
CPC . G01S 7/41; G01S 7/032; G01S 7/282; G01S 7/35; G01S 7/354; G01S 13/93; G01S 13/91

See application file for complete search history.

(56) References Cited

U.S. PATENT DOCUMENTS 6,028,548 A 2/2000 Farmer
6,686,872 B2 2/2004 Vacanti
(Continued)

FOREIGN PATENT DOCUMENTS

CA 2275528 A1 7/1998
DE 102004030841 A1 1/2006
(Continued)

OTHER PUBLICATIONS

Examination Report from counterpart European Application No. 18150489.5, dated Feb. 18, 2021, 6 pp.

(Continued)

*Primary Examiner* — Marc Anthony Armand
(74) *Attorney, Agent, or Firm* — Shumaker & Sieffert, P.A.

(57) ABSTRACT

In some examples, a radar system includes first direct digital synthesizer (DDS) circuitry and first phase-locked loop (PLL) circuitry configured to generate a first sinusoidal signal based on a first DDS signal generated by the first DDS circuitry. In some examples, the radar system further includes transmitter circuitry configured to generate a radar signal based on the first sinusoidal signal. In some examples, the radar system also includes one or more antennas configured to transmit the radar signal and receive a return signal based on the radar signal. In some examples, the radar system includes second DDS circuitry, second PLL circuitry configured to generate a second sinusoidal signal based on a second DDS signal generated by the second DDS circuitry, and receiver circuitry configured to process the return signal based on the second sinusoidal signal.

20 Claims, 13 Drawing Sheets

Related U.S. Application Data

(60) Provisional application No. 62/443,607, filed on Jan. 6, 2017.

(51) Int. Cl.
| | |
|---|---|
| *G01S 7/35* | (2006.01) |
| *G01S 7/292* | (2006.01) |
| *G01S 7/282* | (2006.01) |
| *H03L 7/099* | (2006.01) |
| *H03L 7/22* | (2006.01) |
| *G01S 7/03* | (2006.01) |
| *G01S 13/91* | (2006.01) |

(52) U.S. Cl.
CPC ............... *G01S 7/35* (2013.01); *G01S 7/354* (2013.01); *G01S 13/93* (2013.01); *H03L 7/0991* (2013.01); *H03L 7/22* (2013.01); *G01S 13/91* (2013.01)

(56) References Cited

U.S. PATENT DOCUMENTS

| | | | |
|---|---|---|---|
| 7,002,511 B1 * | 2/2006 | Ammar | G01S 7/282 |
| | | | 342/134 |
| 7,161,527 B2 | 1/2007 | Vacanti | |
| 7,239,266 B2 | 7/2007 | Vacanti | |
| 7,295,151 B2 | 11/2007 | Vacanti | |
| 7,498,994 B2 | 3/2009 | Vacanti | |
| 7,705,773 B2 | 4/2010 | Vacanti | |
| 7,737,880 B2 | 6/2010 | Vacanti | |
| 7,825,851 B2 | 11/2010 | Vacanti | |
| 7,840,075 B2 | 11/2010 | Vacanti | |
| 7,848,266 B2 | 12/2010 | Man et al. | |
| 7,889,114 B2 | 2/2011 | Meyers et al. | |
| 8,160,758 B2 | 4/2012 | Call et al. | |
| 8,259,002 B2 | 9/2012 | Vacanti et al. | |
| 8,330,651 B2 | 12/2012 | Vacanti | |
| 8,633,851 B2 | 1/2014 | Vacanti et al. | |
| 8,704,700 B2 | 4/2014 | Vacanti | |
| 8,791,856 B2 | 7/2014 | Vacanti et al. | |
| 8,866,667 B2 | 10/2014 | Vacanti | |
| 9,000,974 B2 | 4/2015 | Vacanti | |
| 9,194,946 B1 | 11/2015 | Vacanti | |
| 9,229,101 B2 | 1/2016 | Kirk et al. | |
| 9,350,367 B2 | 5/2016 | Ali et al. | |
| 9,354,298 B2 | 5/2016 | Vacanti et al. | |
| 9,417,315 B2 | 8/2016 | Palmer et al. | |
| 9,503,109 B2 | 11/2016 | McLaurin et al. | |
| 2003/0071753 A1 | 4/2003 | Vacanti | |
| 2007/0139259 A1 | 6/2007 | Vacanti | |
| 2007/0139261 A1 | 6/2007 | Vacanti | |
| 2008/0074338 A1 | 3/2008 | Vacanti | |
| 2009/0058714 A1 | 3/2009 | Vacanti | |
| 2009/0072957 A1 | 3/2009 | Wu et al. | |
| 2009/0273504 A1 | 11/2009 | Meyers et al. | |
| 2010/0097263 A1 | 4/2010 | Vacanti | |
| 2010/0188290 A1 | 7/2010 | Vacanti | |
| 2010/0256840 A1 | 10/2010 | Call et al. | |
| 2011/0025546 A1 * | 2/2011 | Cook | G01S 13/534 |
| | | | 342/22 |
| 2011/0122017 A1 | 5/2011 | Vacanti | |
| 2012/0146837 A1 | 6/2012 | Vacanti et al. | |
| 2012/0154203 A1 | 6/2012 | Vacanti et al. | |
| 2012/0200447 A1 | 8/2012 | Vacanti | |
| 2012/0256781 A1 | 10/2012 | Vacanti et al. | |
| 2013/0214963 A1 | 8/2013 | Vacanti | |
| 2013/0321194 A1 | 12/2013 | Kirk et al. | |
| 2014/0070985 A1 | 3/2014 | Vacanti | |
| 2014/0085124 A1 | 3/2014 | Dusik et al. | |
| 2014/0292561 A1 | 10/2014 | Vacanti et al. | |
| 2015/0084808 A1 | 3/2015 | Vacanti | |
| 2015/0338505 A1 | 11/2015 | Oshima et al. | |
| 2016/0274271 A1 | 9/2016 | Lukas et al. | |
| 2016/0327422 A1 | 11/2016 | Gluth et al. | |
| 2018/0196124 A1 | 7/2018 | Vacanti et al. | |

FOREIGN PATENT DOCUMENTS

| | | | |
|---|---|---|---|
| EP | 1782095 A2 | 5/2007 | |
| EP | 1784662 A2 | 5/2007 | |
| EP | 1798567 A2 | 6/2007 | |
| EP | 1798568 A2 | 6/2007 | |
| EP | 1860456 A1 | 11/2007 | |
| EP | 1906488 A2 | 4/2008 | |
| EP | 1980873 A2 | 10/2008 | |
| EP | 2042886 A2 | 4/2009 | |
| EP | 2113789 A2 | 11/2009 | |
| EP | 2180336 A2 | 4/2010 | |
| EP | 2211200 A1 | 7/2010 | |
| EP | 2216852 A2 | 8/2010 | |
| EP | 2325671 A2 | 5/2011 | |
| EP | 2362239 A1 | 8/2011 | |
| EP | 2463684 A1 | 6/2012 | |
| EP | 2485063 A1 | 8/2012 | |
| EP | 2508912 A1 | 10/2012 | |
| EP | 2631666 A1 | 8/2013 | |
| EP | 2706373 A1 | 3/2014 | |
| EP | 2706375 A1 | 3/2014 | |
| EP | 2713181 A1 | 4/2014 | |
| EP | 2857857 A1 | 4/2015 | |
| EP | 2857858 A1 | 4/2015 | |
| EP | 2863239 A1 | 4/2015 | |
| EP | 2901178 A1 | 8/2015 | |
| GB | 2094091 A | 9/1982 | |
| WO | 2006024008 A2 | 3/2006 | |
| WO | 2006135409 A2 | 12/2006 | |
| WO | 2014052060 A1 | 4/2014 | |
| WO | 2015090769 A1 | 6/2018 | |

OTHER PUBLICATIONS

Extended Search Report from counterpart European Patent Application No. 18150489.5, dated Jun. 13, 2018, 8 pp.

Response to Communication dated Jun. 13, 2018, from counterpart European Patent Application No. 18150489.5, filed on Sep. 18, 2018, 16 pp.

Examination Report from counterpart European Application No. 18150489.5, dated Sep. 19, 2019, 6 pp.

Response to Examination Report dated Sep. 19, 2019, from counterpart European Application No. 18150489.5, filed Jan. 6, 2020, 9 pp.

Wang, "Design of Frequency Synthesizer for Synchronizing Airborne Bistatic SAR Systems," 2008 IEEE Aerospace Conference, Mar. 1, 2008, 10 pp.

Xuehua et al., "Development of Frequency Synthesizer based on DDS+PLL" RADAR, 2011 IEEE CIE International Conference, Oct. 24, 2011, pp. 1251-1254.

Prosecution History from U.S. Appl. No. 15/703,817, dated Oct. 10, 2019 through Jul. 6, 2020, 39 pp.

Response to Examination Report dated Feb. 18, 2021, from counterpart European Application No. 18150489.5, filed Jun. 11, 2021, 213 pp.

* cited by examiner

SYNTHESIZER FOR RADAR SENSING

This application is a divisional of U.S. patent application Ser. No. 15/703,817, filed Sep. 13, 2017, which claims the benefit of U.S. Provisional Patent Application No. 62/443,607, filed Jan. 6, 2017, the entire contents of each of which are incorporated herein by reference.

TECHNICAL FIELD

This disclosure relates to radar systems.

BACKGROUND

A radar system may generate and transmit a radar signal at a specific frequency. The radar system may determine the distance to an object based on the time between transmission of the radar signal and the receipt of the return signal. The radar system may determine the whether the object is moving, and the velocity of the object, based on the frequency of the return signal. The frequency of the return signal is based on the velocity of the object because of the Doppler effect. The radar system may determine the change in frequency due to the Doppler effect by comparing the frequency of the return signal to the frequency of the radar signal.

SUMMARY

This disclosure describes radar systems including one or more synthesizers configured to produce waveforms for transmitter circuitry and receiver circuitry. Each synthesizer may include direct digital synthesizer (DDS) circuitry configured to generate a DDS signal. The DDS circuitry may be configured to deliver the DDS signal to drive phase-locked loop (PLL) circuitry of the synthesizer to generate a sinusoidal signal. In some examples, the PLL circuitry may include an integer-N PLL. A radar system of this disclosure may achieve functionality that is comparable to much more expensive and complex existing radar systems. For example, complex existing radar systems may include a higher number of semiconductor parts than a radar system of this disclosure. In addition, the techniques of this disclosure may allow the construction of radar systems configured to operate in S-band and the construction of radar systems configured to operate in X-band. The construction of an X-band radar system may be similar to the construction of an S-band radar system, except with a different multiplier.

In some examples, a radar system includes first DDS circuitry and first PLL circuitry configured to generate a first sinusoidal signal based on a first DDS signal generated by the first DDS circuitry. The radar system also includes transmitter circuitry configured to generate a radar signal based on the first sinusoidal signal, one or more antennas configured to transmit the radar signal and receive a return signal based on the radar signal, and second DDS circuitry. The radar system further includes second PLL circuitry configured to generate a second sinusoidal signal based on a second DDS signal generated by the second DDS circuitry and receiver circuitry configured to process the return signal based on the second sinusoidal signal.

In some examples, a radar system includes DDS circuitry and PLL circuitry configured to generate a sinusoidal signal based on a DDS signal generated by the DDS circuitry. The radar system also includes quadrature conversion circuitry configured to generate a converted signal based on the sinusoidal signal. The radar system further includes transmitter circuitry configured to generate a radar signal based on the converted signal. The radar system includes one or more antennas configured to transmit the radar signal and receive a return signal based on the radar signal and receiver circuitry configured to process the return signal based on the sinusoidal signal.

In some examples, a radar system includes DDS circuitry and PLL circuitry configured to generate a sinusoidal signal based on a DDS signal generated by the DDS circuitry. The radar system also includes frequency multiplier circuitry configured to generate a multiplied signal based on the sinusoidal signal. The radar system further includes transmitter circuitry configured to generate a radar signal based on the multiplied signal. The radar system includes one or more antennas configured to transmit the radar signal and receive a return signal based on the radar signal and receiver circuitry configured to process the return signal based on the multiplied signal.

DETAILED DESCRIPTION

Various examples are described below generally directed to devices, systems, and methods for radar systems. Weather radar system and marine radar devices can cost thousands of dollars. As a result, it may be desirable to design a high-performance radar system using low-cost components. It may also be desirable to design a radar system that includes components that can be included in other radar systems, such that the manufacture and design of the radar systems may benefit from economies of scale.

This disclosure is directed to systems, devices, and methods for radar systems including a transmitter and receiver. The radar system may generate a radar signal based on a sinusoidal signal generated by phase-locked loop (PLL) circuitry. The PLL circuitry may be driven by direct drive synthesizer or direct digital synthesizer (DDS) circuitry. The transmitter circuitry and receiver circuitry may operate using the same sinusoidal signal. In some examples, the transmitter circuitry and receiver circuitry may use different sinusoidal signals, where the sinusoidal signals are based on a single clock signal.

To generate a radar signal for transmission, DDS circuitry may operate as a radio-frequency (RF) synthesizer in a radar device. The DDS circuitry may drive PLL circuitry to generate a sinusoidal signal including a frequency that is approximately equal to the desired frequency of the radar system. In some examples, frequency multiplier circuitry may generate a multiplied signal based on the sinusoidal signal, where the multiplied signal has a frequency that is approximately equal to the desired frequency of the radar system. This disclosure may cover a very wide band radar, depending on the ability to change out the antenna, because an X-band radar system may differ from an S-band radar system in only the frequency multiplier circuitry.

In some examples, a radar system of this disclosure may include lower-cost components and/or a lower number of components, as compared to other radar systems. The radar system may also equal or exceed other radar systems in performance. The radar system may be used in many applications including weather radar, marine radar, aviation radar, object detection, and/or any other applications. The radar system may be configured to perform well by modulating a waveform at a specific RF, but the radar system of this disclosure may not be configured to operate at numerous frequency bands like much more expensive radar systems. Nonetheless, in some examples, the possibility of much lower costs for a radar system of this disclosure may offset the reduced agility, as compared to more expensive radar systems.

Figure 1:
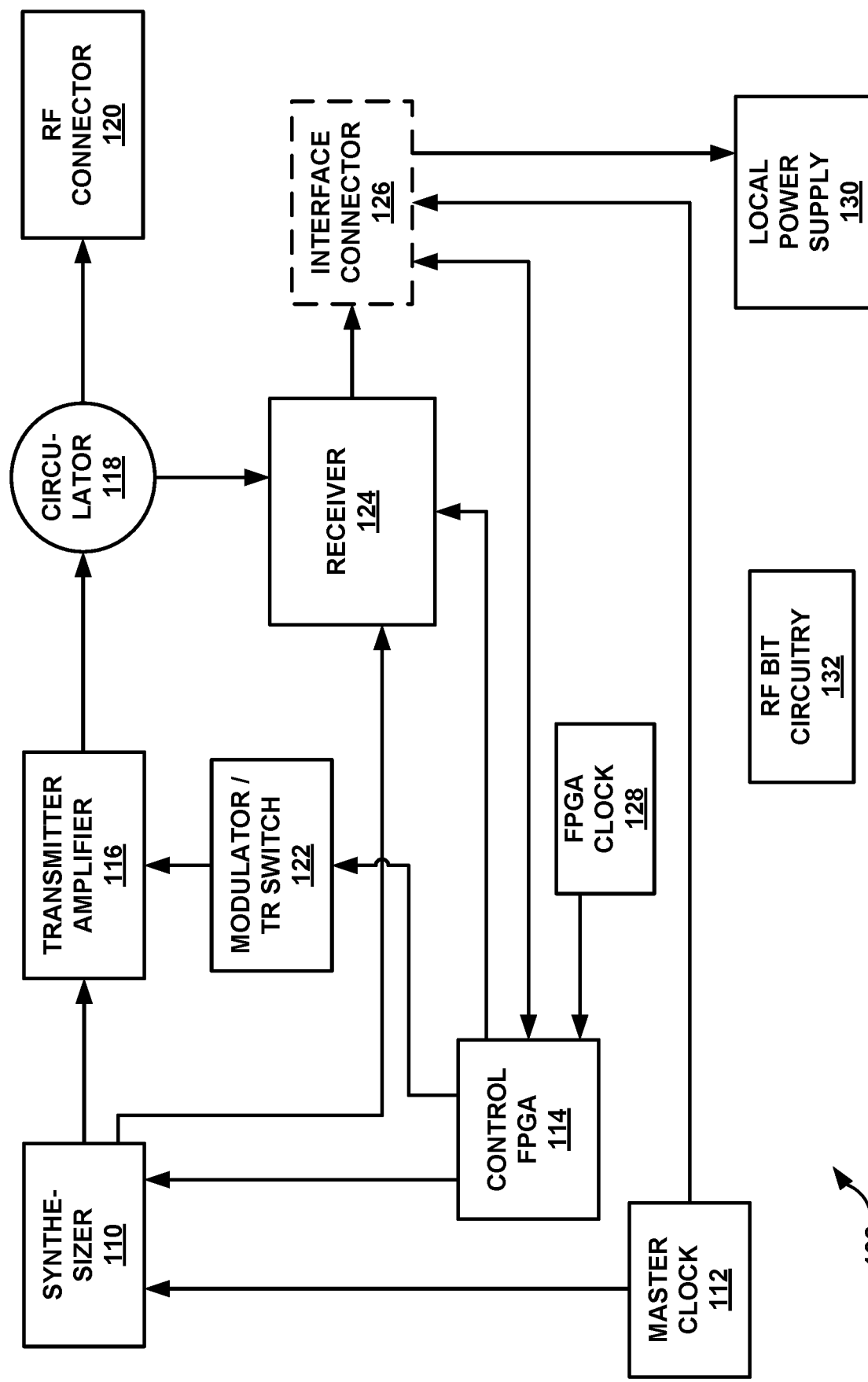
FIG. 1 is a conceptual block diagram depicting a radar system including a synthesizer configured to generate a sinusoidal signal, in accordance with some examples of this disclosure.

FIG. 1 is a conceptual block diagram depicting a radar system 102 including a synthesizer 110 configured to generate a sinusoidal signal, in accordance with some examples of this disclosure. Radar system 102 may be a single integrated device, so multiple device or discrete components. In some examples, radar system 102 may include a printed circuit board (PCB) including one or more components mounted to the PCB.

Synthesizer 110 may include DDS circuitry and PLL circuitry. The DDS circuitry may be configured to generate DDS signals to drive the PLL circuitry to generate a sinusoidal signal. The PLL circuitry may include fixed-frequency PLL circuitry and/or integer-N PLL circuitry configured to generate a sinusoidal frequency. In some examples, the PLL circuitry may have a divide-by ratio of twenty-four or any other suitable number to generate a frequency that is faster or slower than the frequency generated by master clock 112. In some examples, the sinusoidal signal may include a frequency in the S band, which includes frequencies of approximately three gigahertz or thirty-one hundred megahertz. In some examples, radar system 102 may include frequency multiplier circuitry configured to generate signals in the X-band of frequencies of approximately nine gigahertz or ninety-three hundred megahertz.

Master clock 112 is configured to generate a clock signal for synthesizer 110. The clock signal may have a frequency in the range of one hundred to two hundred megahertz. In some examples, master clock 112 may include crystal oscillator circuitry. In some examples, radar system 102 may include a single master clock for the transmitter circuitry and receiver circuitry, instead of multiple unreferenced oscillators. Oscillators may be unreferenced if they are not locked or synchronized to each other. In some examples, unreferenced may result in increased noise and coherency issues. Two separate, independently operating oscillators may independently fluctuate in frequency.

Fluctuating frequencies may make it difficult to measure the Doppler effect because it may be difficult to measure the difference in frequency between a transmitted signal and a received signal. Radar system 102 may use the difference in frequency between the transmitted signal and the received signal to determine the velocity of a detected object. In some examples, a single master clock may allow radar system 102 to lock the transmitter circuitry and receiver circuitry to a single reference clock signal.

Control field programmable gate array (FPGA) 114 is configured to generate control signals for synthesizer 110, modulator/transmission (TR) switch 122, receiver 124, and interface connector 126. For example, control FPGA 114 may generate a control signal that turns on and off the DDS circuitry in synthesizer 110. FPGA clock 128 may provide a clock signal for control FPGA 114.

Transmitter amplifier 116 is configured to increase and/or decrease the power of radar signals before transmission. Transmitter amplifier 116 may include one or more amplifier circuits and one or more attenuation circuits. Modulator/TR switch 122 is configured to control transmitter amplifier 116.

Circulator 118 is configured to deliver radar signals from transmitter amplifier 116 to radio-frequency (RF) connector 120. Circulator 118 is further configured to deliver return signals from RF connector 120 to receiver 124.

RF connector 120 may include one or more antennas for transmission and receipt of radar signals. The one or more antennas may include coil antennas, loop antennas, dipole antennas, and/or any other suitable type of antennas.

Receiver 124 may include low-noise amplifier (LNA) circuitry, mixer circuitry (e.g., an image-reject mixer), limiter circuitry, intermediate-frequency (IF) amplifier circuitry, and band-pass filter (BPF) circuitry. Receiver 124 may be configured to process return signals. Receiver 124 may be configured to generate processed signals and deliver the processed signals to processing circuitry that is configured to determine the existence of a target (e.g., a particle or object). The processing circuitry may include signal processing circuitry that is configured to separate, filter, and/or convert signals based on the desired sensitivity to frequency and/or range.

Interface connector 126 is an optional component for connecting to an external component. Interface connector 126 may be configured to receive digital signals, RF signals, or direct-current (DC) power. Interface connector 126 may be configured to deliver processed signals to an output device that is configured to generate a presentation to a user. The presentation may include video and/or audio that is displayed and/or generated for the user. The output device may be configured to generate alerts for the user based on the processing signals. For example, the output device may generate an alert for a possible collision or inclement weather.

Local power supply 130 is configured to supply power to the components of radar system 102. Local power supply 130 may include a battery, an electrical connection to an external power supply, and/or power-electronics circuitry. RF built-in test (BIT) circuitry 132 is configured to perform tests of radar system 102. In some examples, RF BIT circuitry 132 may be integrated into control FPGA 114.

In some examples, a radar system may include a transmitter chain and a receiver chain. Each chain may include a synthesizer including DDS circuitry and PLL circuitry configured to generate a waveform. Each chain may also include amplifier(s) and filter(s) to modulate the waveform signals for use by the receiver and transmitter.

Figure 2:
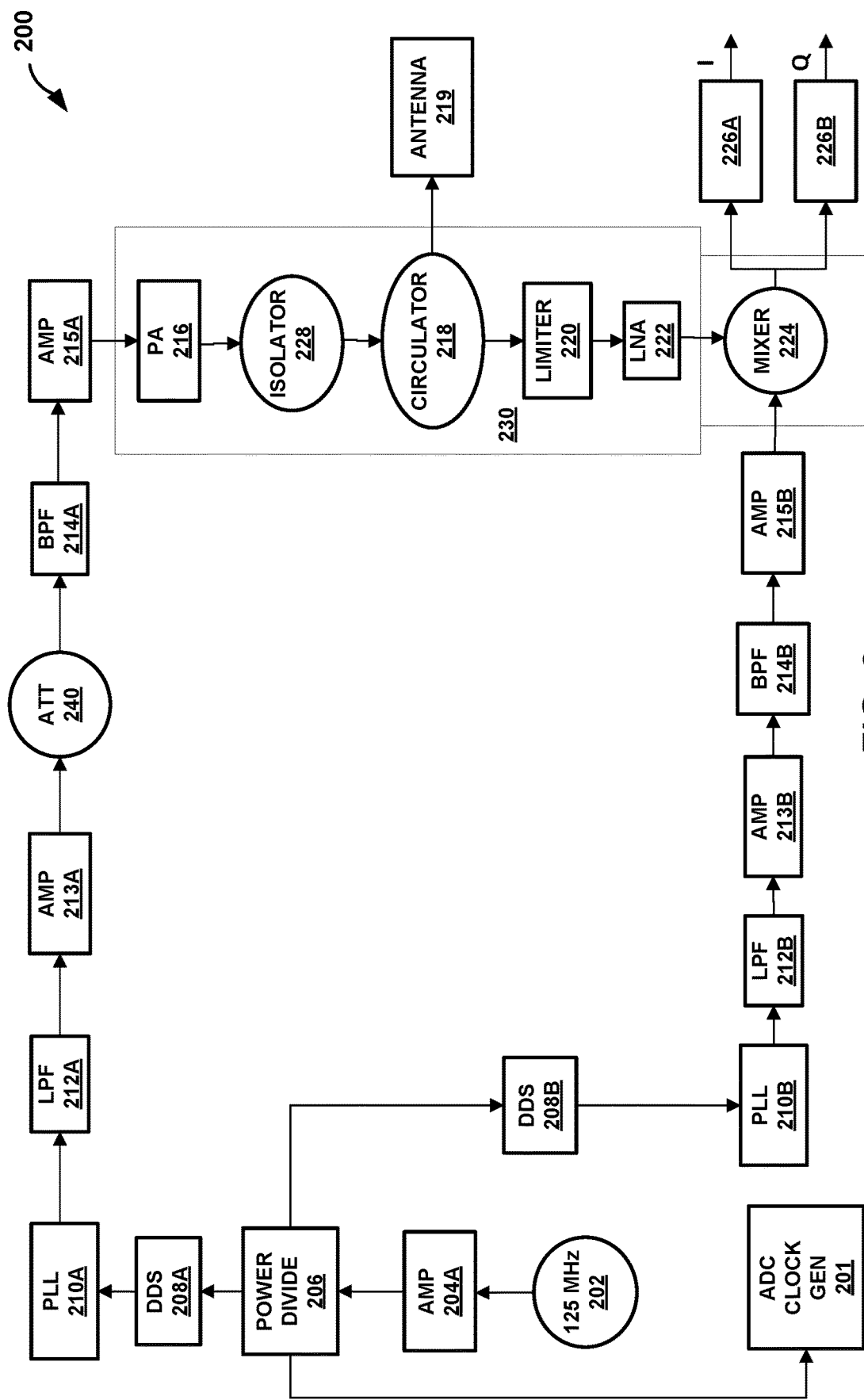
FIG. 2 is a conceptual block diagram depicting a radar system including two synthesizers, in accordance with some examples of this disclosure.

FIG. 2 is a conceptual block diagram depicting a radar system 200 including two synthesizers, in accordance with some examples of this disclosure. The first synthesizer may include DDS circuitry 208A and PLL circuitry 210A, and the second synthesizer may include DDS circuitry 208B and PLL circuitry 210B. DDS circuitry 208A and 208B may include an integrated circuit such as AD9954 manufactured by ANALOG DEVICES. In some examples, one or both of DDS circuitry 208A and 208B may include a digital-to-analog converter (DAC) at an output to generate an alternating-current (AC) signal (e.g., a DDS signal) based on the clock signal received from clock generator circuitry 202 through amplifier 204A and power-divider circuitry 206. In some examples, DDS circuitry 208A and 208B may be configured to generate a DDS signal at a frequency that is proportional to a digital value stored to a control register of each of DDS circuitry 208A and 208B. The stored digital value may be a preset value, or the stored digital value may be changed by processing circuitry such that sinusoidal signals generated by PLL circuitry 210A and 210B have a desirable frequency, such as a frequency in the S band (e.g., approximately three gigahertz).

PLL circuitry 210A and 210B may include an integrated circuit such as ADF4355 manufactured by ANALOG DEVICES with a fixed N of twenty-four, such that the output frequency from the PLL is twenty-four times higher than the input frequency to the PLL. In some examples, PLL circuitry 210A and 210B may include a fixed-N synthesizer and/or an integer-N synthesizer. PLL circuitry 210A and 210B may be configured to generate sinusoidal signals based on the frequency of the input signals (e.g., the DDS signals) and the divide-by ratios (e.g., twenty-four). Thus, PLL circuitry 210A and 210B may be configured to generate sinusoidal signals at frequencies that are proportional to the frequencies of the DDS signals and proportional to divide-by ratios. As a result, if the clock signal has a frequency of one hundred and twenty-five megahertz, and the divide-by ratios are twenty-four, then the sinusoidal signals may have frequencies of approximately three gigahertz.

Clock generator circuitry 201 and 202 is configured to generate a clock signal for DDS circuitry 208A and 208B. Clock generator circuitry 201 and 202 may generate a clock signal with a frequency of one hundred and twenty-five megahertz. Clock generator circuitry 201 and 202 may include an amplifier such as a GVA123+ manufactured by MINI-CIRCUITS. Clock generator circuitry 201 and 202 may be configured to generate and deliver a clock signal to DDS circuitry 208A and 208B through amplifier 204A and power-divider circuitry 206. DDS circuitry 208A and 208B may be configured to generate DDS signals based on the clock signal.

Low-pass filters 212A and 212B may be configured to filter higher-frequency signals from the sinusoidal signals generated by PLL circuitry 210A and 210B to generate low-filtered signals. Low-pass filters 212A and 212B may attenuate or remove the higher-frequency signals low-filtered signals. The cut-off frequency of low-pass filters 212A and 212B may be slightly higher than the frequency of the sinusoidal signals generated by PLL circuitry 210A and 210B. In some examples, the desired frequency of the sinusoidal signals may be approximately three gigahertz for S-band radar. An X-band radar system may include a frequency multiplier circuit configured to increase the frequency before transmitting a radar signal.

Low-pass filters 212A and 212B may include discrete components, microstrip components, and/or edge-coupled components. Band-pass filters 214A and 214B may also include discrete components, microstrip components, and/or edge-coupled components. BPF's 214A and 214B may be configured to filter out higher- and lower-frequency signals to produce band-filtered signals based on the input signals, which may be the sinusoidal signals from PLL circuitry 210A and 210B, the low-filtered signals from LPF's 212A and 212B, and/or signals from amplifiers 213A and 213B. In some examples, any of the filters herein may include an edge-coupled copper microstrip filter on a PCB. Amplifier 213A may be configured to change the power of the signal generated by LPF 212A and deliver the amplified signal to attenuator 240 and BPF 214A. Amplifier 215A may be configured to amplify (e.g., increase the power across a frequency band) the signal generated by BPF 214A and deliver the amplified signal to power amplifier (PA) 216. BPF's 214A and 214B and attenuator 240 may be configured to attenuate or remove lower-frequency signals and higher-frequency signals, leaving signals within a band of signals relatively unchanged. The passband of BPF's 214A and 214B may include the desired waveform of the radar signal for transmission by antenna 219. Amplifiers 215A and 215B may be configured to amplify the band-filtered signals by increasing the power of the band-filtered signals.

The transmitter circuitry, which may include PA 216, circulator 218, and isolator 228 in some examples, may include one or more amplifiers and isolator circuitry. In some examples, the transmitter circuitry may be configured to operate in pulsed mode and/or FMCW mode. The DDS and PLL circuitries may be configured to generate the linear frequency modulation for PA 216 and the receiver circuitry. Circulator 218 may be configured to deliver radar signals to an antenna for transmission and deliver return signals from antenna 219 to the receiver circuitry, which may include circulator 218, limiter 220, low-noise amplifier 222, and mixer 224. The transmitter circuitry may be configured to generate radar signals based on the sinusoidal signals from PLL circuitry 210A, the band-filtered signals from BPF 214A, and/or signals from amplifier 213A and 215A. The transmitter circuitry may be configured to generate radar signals in FMCW mode and/or in a pulsed mode.

The receiver circuitry may be configured to process the return signals received by antenna 219. The receiver circuitry may include LNA 222 such as HMC902 manufactured by ANALOG DEVICES, and mixer 224 such as HMC1056 manufactured by ANALOG DEVICES. The receiver circuitry may be configured to process return signals received by antenna 219 based on the sinusoidal signals from PLL circuitry 210B, the band-filtered signals from BPF 214B, and/or signals from amplifiers 213B and 215B. The receiver circuitry may be configured to generate processed signals based on the return signals and the sinusoidal signals from PLL circuitry 210B, the low-filtered signals from LPF 212B, the band-filtered signals from BPF 214B, and/or the signals from amplifiers 213B and 215B.

Figure 10:
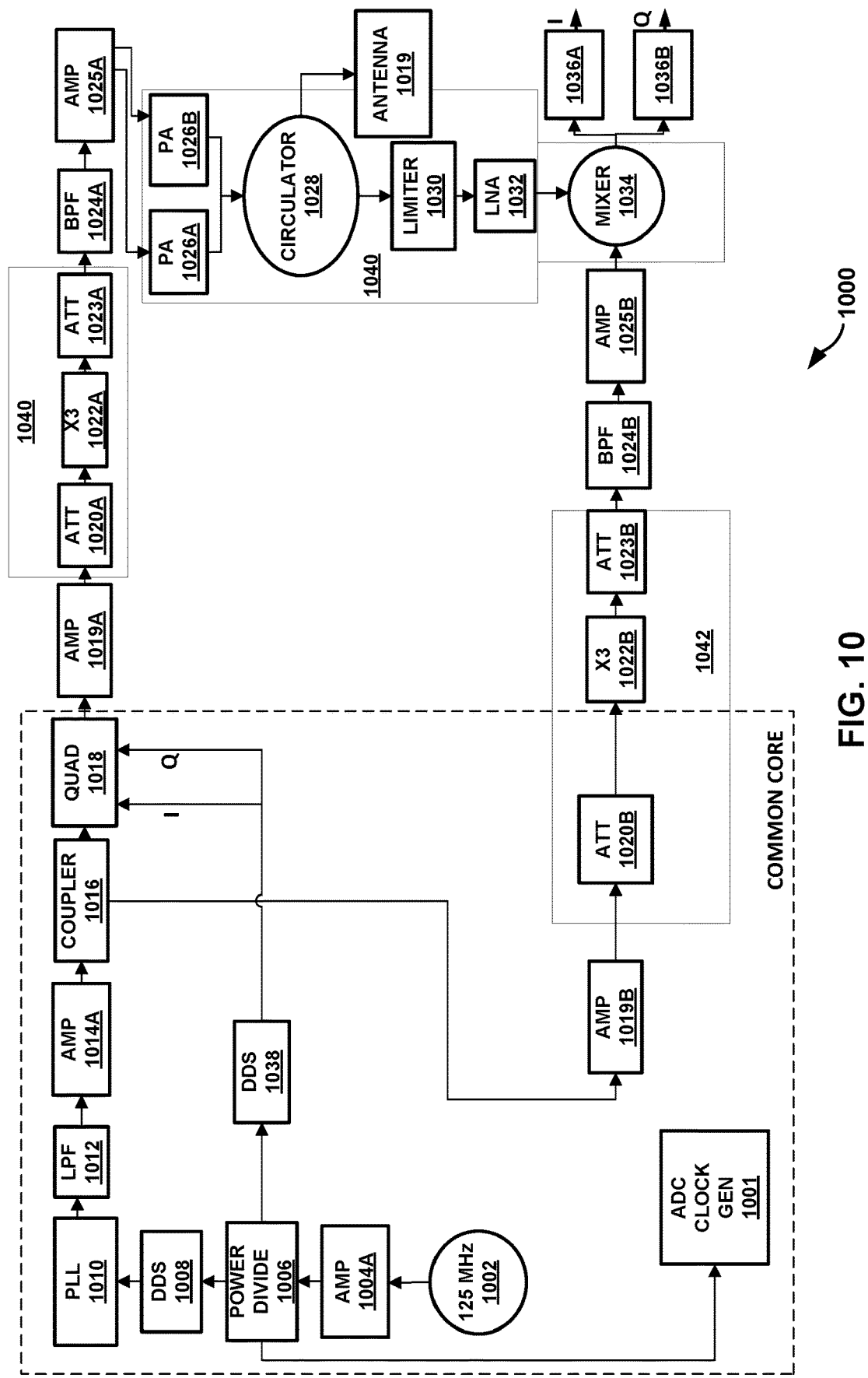
FIGS. 10-13 are conceptual block diagrams depicting radar systems including a single synthesizer and a quadrature up-converter, in accordance with some examples of this disclosure.
Figure 11:
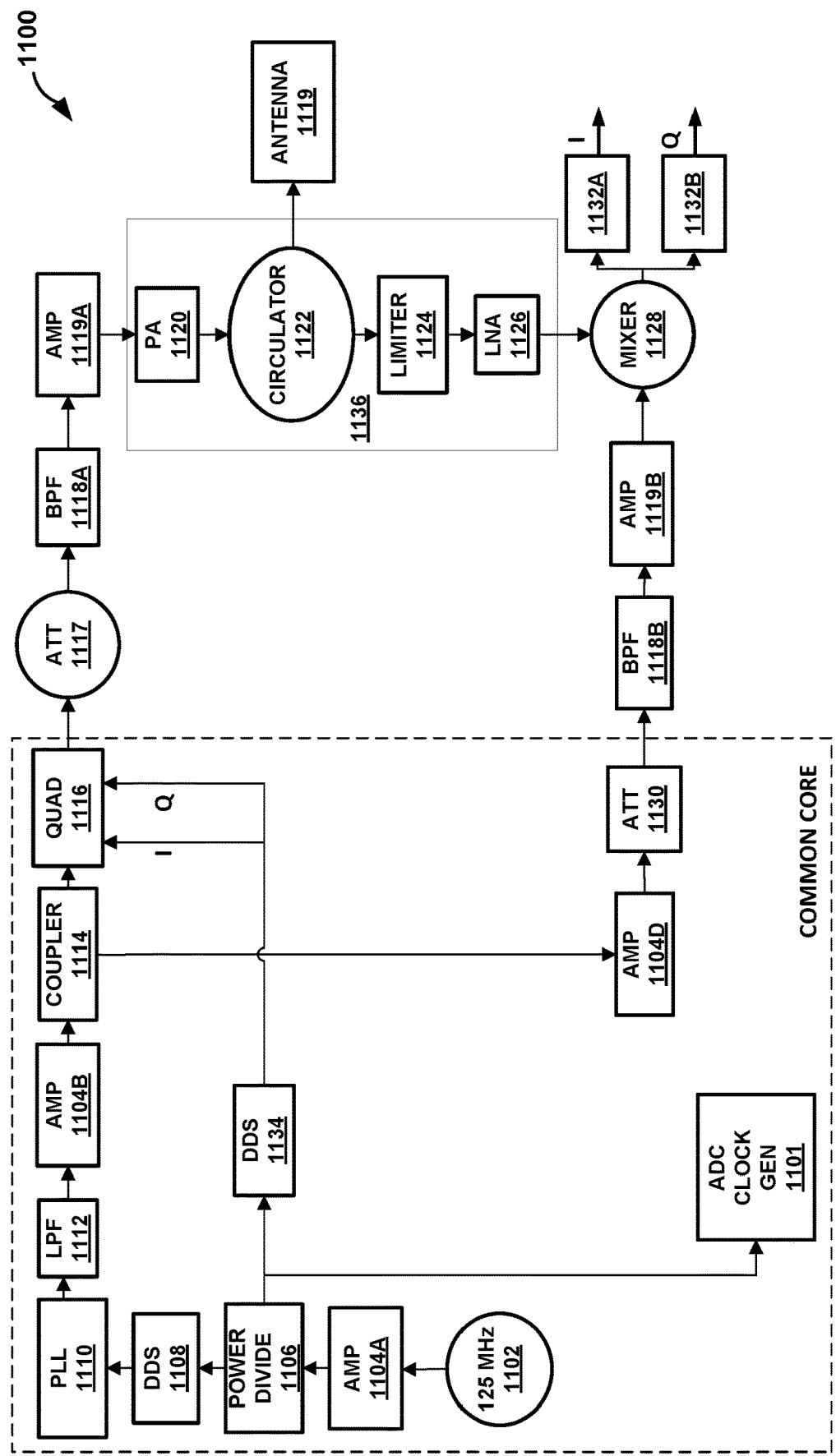
Figure 12:
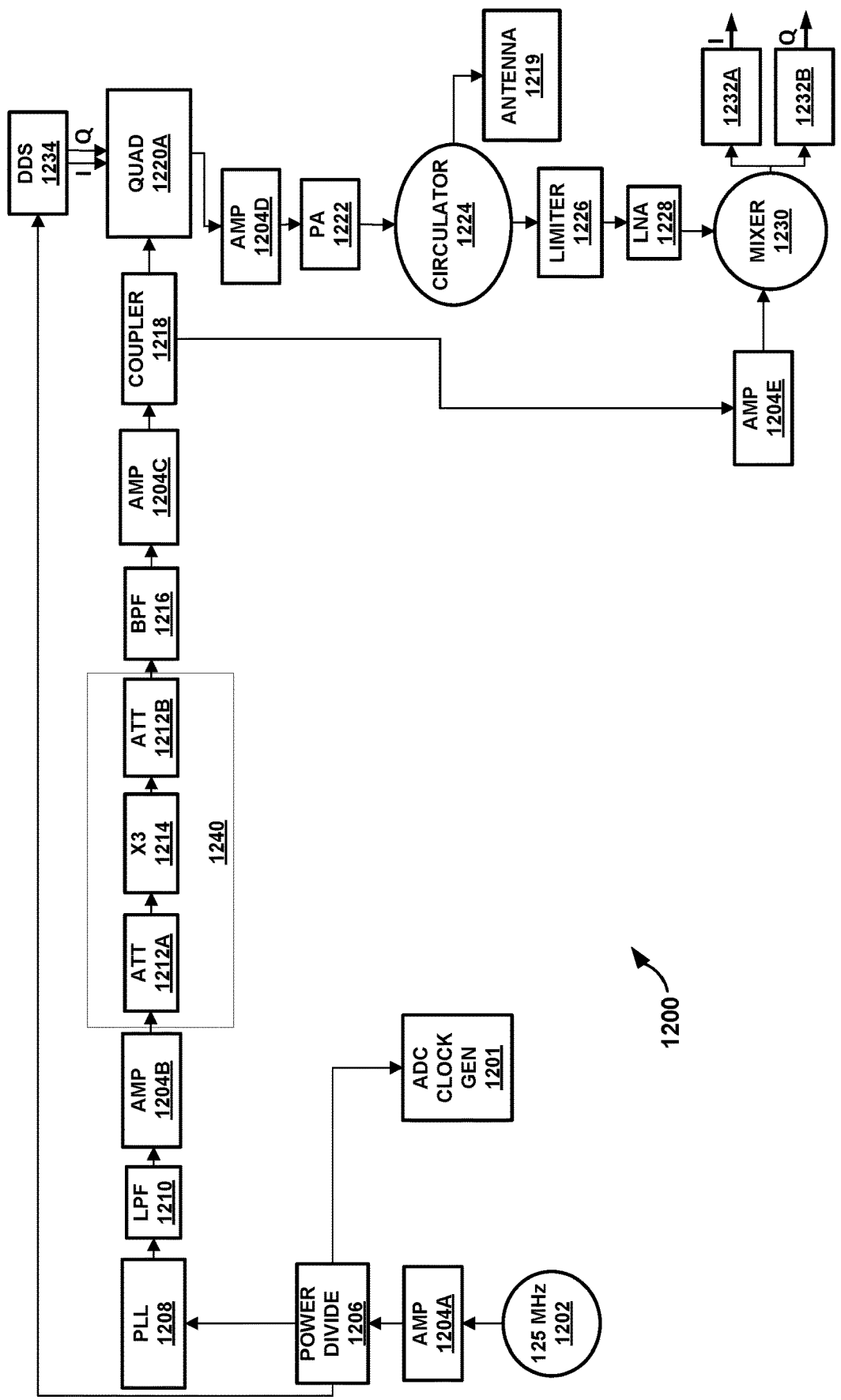
Figure 13:
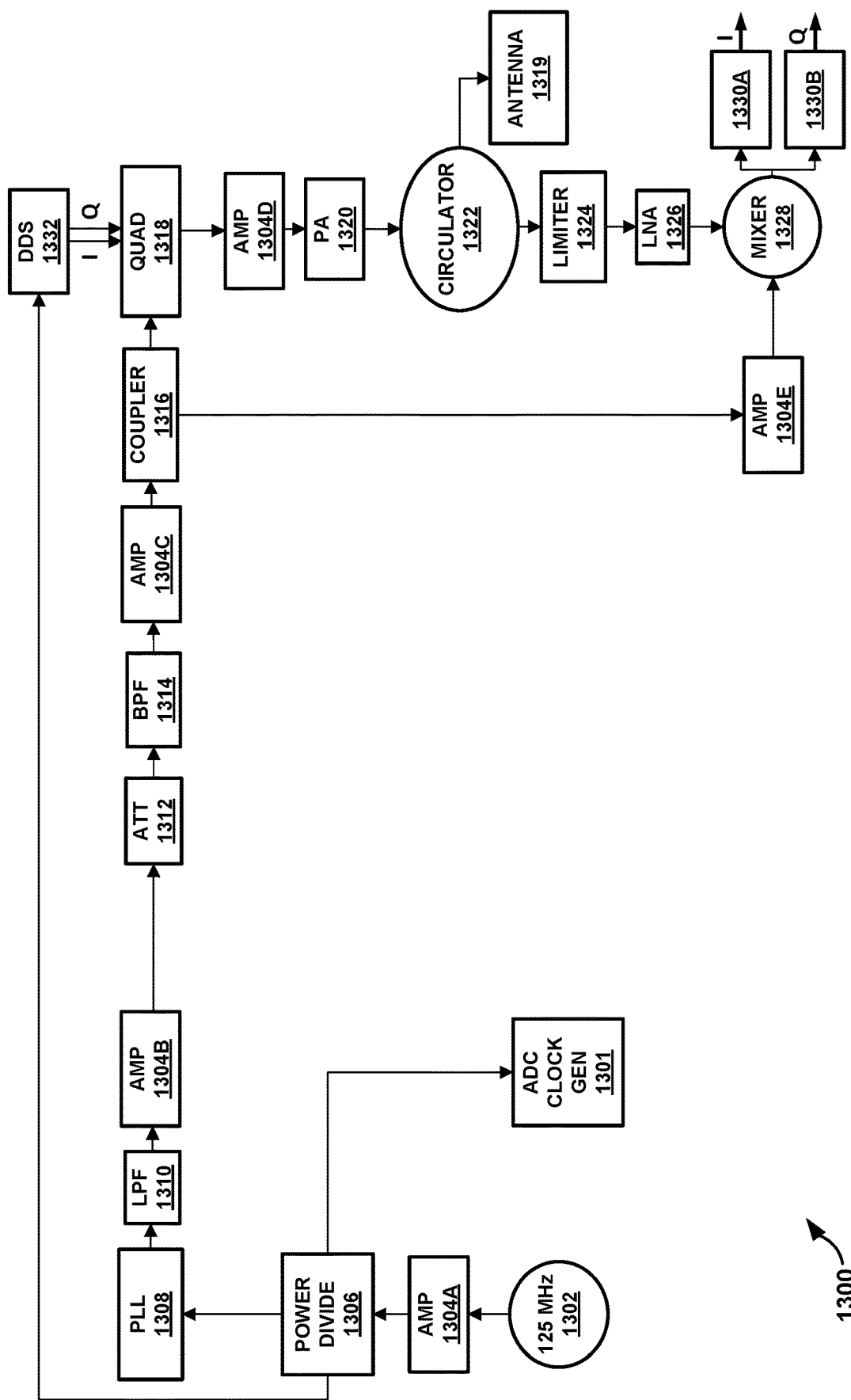

Block 230 represents components of radar system 200 that may be implemented in any of the radar systems of FIGS. 2-7 and 10-13 (e.g., a common core). As shown in FIGS. 10 and 11, the front-end components (e.g., DDS circuitry, PLL circuitry, coupler circuitry, and quadrature converter) may also make up another common core. Radar system 200 may also include processing circuitry and/or an output device (not shown in FIG. 2). The processing circuitry, which may include processing circuitry 226A and 226B, may be configured to determine existence of a target based on a processed signal generated by the receiver circuitry.

By using a single clock source for both synthesizers, radar system 200 may have increased coherence such that the receiver circuitry can compare return signals to a copy of the radar signals (or carrier signal) generated by circuitry in the receiving chain. Coherency may improve, for example, the measurement of the velocity of objects by radar system 200, which may be based on the Doppler effect.

Radar system 200 may include very short-range operation capability, inside one hundred feet or even ten feet. A local oscillator (LO) may be available before transmit power turns off. In the example of PLL circuitry 210A and 210B such as ADF4355, Transmit Mute if Lock Detect goes low, allowing transmission to be shut down completely if the DDS circuitry is stopped. Will return power automatically with DDS circuitry applied. This also allows receiver mute with no LO applied until end of transmit pulse, separate LO DDS allows fixed LO and any desired IF offset frequency. Heterodyne frequency-modulated continuous wave (FMCW) may be possible with this system, zero IF is also possible but would have high-phase noise due to different PLL sources.

If antenna 219 receives high RF power signals, limiter 220 may be configured to protect LNA 222 by limiting the RF signals coming in to the receiver (e.g., LNA 222, mixer 224, and processing circuitry 226A and/or 226B). Limiter 220 may be configured to limit the signal in to the receiver in order to prevent damage to the receiver and keep the receiver out of saturation. Isolator 228 may be configured to isolate the power amplifier (e.g., amplifier 215A) from energy coming back into circulator 218 from antenna 219 to amplifier 215A. Isolator 228 may be configured to provide a stable environment for amplifier 215A. Isolator 228 may be configured to reduce the amount of energy that gets bounced back and forth at antenna 219 due to mismatch on antenna 219, water on antenna 219, and/or damage to antenna 219. Isolator 228 may be configured to prevent the energy from antenna 219 flowing backwards through circulator 218 to amplifier 215A. Therefore, isolator 228 may be configured to isolate amplifier 215A from antenna 219 and from the receiver.

Processing circuitry 226A and 226B, along with additional circuitry not shown in FIG. 2, may be configured to determine the existence, location, and velocity of a target or particle based on the signals received from mixer 224. Mixer 224 and the receiver circuitry may be configured to generate a processed signal based on the return signal received by antenna 219. Radar system 200 may further include an output device, such as a display device or an audio device, configured to output a presentation based on the determination of processing circuitry 226A and 226B as to the existence of a target. The presentation may be a visual display of the location of the target or an audio alert to indicate a possible collision with the target.

In some examples, a radar system may include frequency multiplier circuitry in order to generate a higher-frequency waveform signal. For example, the frequency multiplier circuitry may be configured to generate an X-band waveform based on an S-band waveform. The frequency multiplier circuitry may include attenuator circuitry configured to prevent interference between the multiplier circuitry (e.g., a tripler) and filter circuitry and amplifiers.

Figure 3:
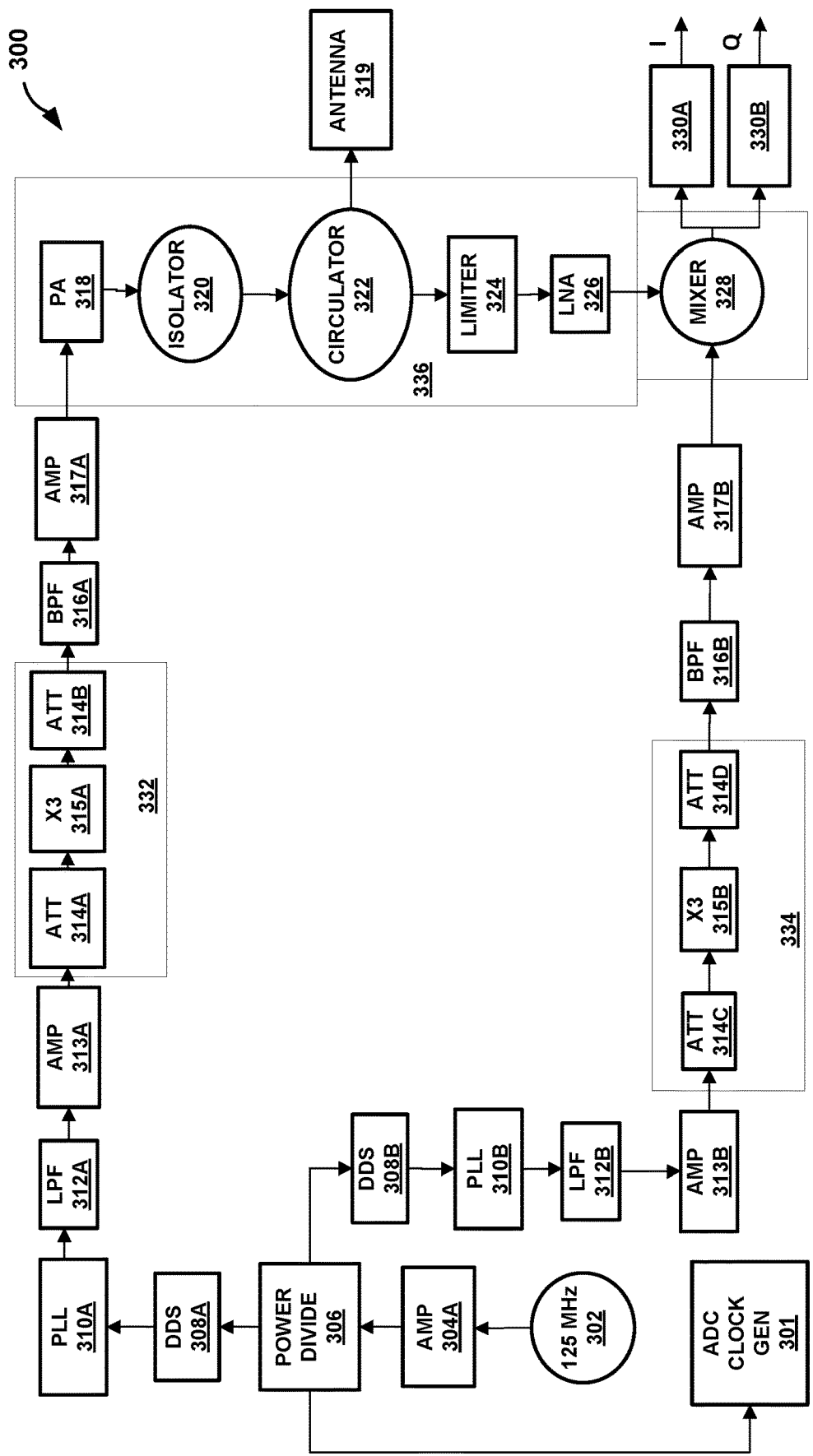
FIG. 3 is a conceptual block diagram depicting a radar system including two synthesizers and two frequency multiplier circuits, in accordance with some examples of this disclosure.

FIG. 3 is a conceptual block diagram depicting a radar system 300 including two synthesizers and two frequency multiplier circuits 332 and 334, in accordance with some examples of this disclosure. In some examples, frequency multiplier circuits 332 and 334 may triple the frequency of the sinusoidal signals generated by synthesizers, the low-filtered signals from LPF's 312A and 312B, and/or the signals from amplifiers 313B and 313B. As depicted in FIG. 3, each of frequency multiplier circuits 332 and 334 may include two attenuation circuits (ATT) 314A-314D and a frequency tripler or multiplier (×3) 315A and 315B. Frequency multiplier circuits 332 and 334 may include an integrated circuit such as RMK-K-1052 manufactured by MINI-CIRCUITS.

Frequency multiplier circuits 332 and 334 may be configured to deliver multiplied signals to BPF's 316A and 316B, amplifiers 317A and 317B, and/or PA 318 and the receiver circuitry. In some examples, a frequency of the output signal of frequency multiplier circuits 332 and 334 may be three times a frequency of the input signal to frequency multiplier circuits 332 and 334. In some examples, the multiplication factor or division factor of frequency multiplier circuits 332 and 334 may be more or less than three.

For example, attenuators 314A and 314B may be configured to provide a good broadband match for frequency tripler or multiplier 315A. Attenuators 314A and 314B may also be configured to set the level (e.g., frequency level or amplitude level) into tripler 315A. Band-pass filter (BPF) 316A may be configured to limit the signal from tripler 332 to the desired signal. BPF 316A may also be configured to meet emission standards and remove any remaining local oscillator (LO) signal. Attenuator 314B may be configured to ensure a broadband match and reduce the return loss between tripler 315A and BPF 316. Attenuator 314B may be configured to prevent unwanted interaction between tripler 315A and BPF 316. In some examples, each of attenuators 314A-314D and BPF 316A and 316B may include microstrip components, edge-coupled components, and/or discrete components.

In some examples, a radar system may also include coupler circuitry configured to deliver a waveform from one chain (e.g., the transmitter chain) to another chain (e.g., the receiver chain). The coupler circuitry may increase the coherency of the radar system by ensuring the same waveform is delivered to the transmitter circuitry and the receiver circuitry.

Figure 4:
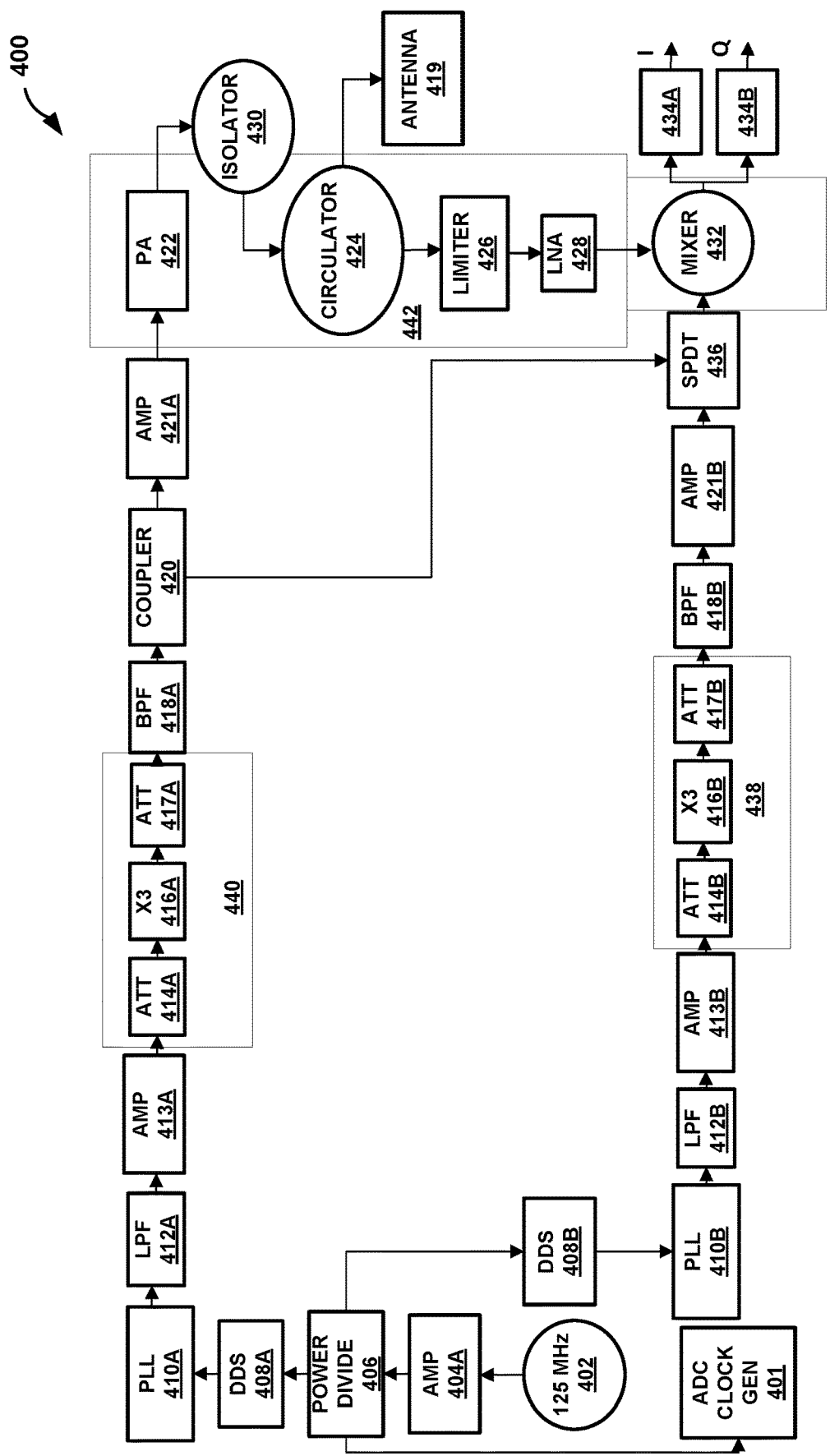
FIG. 4 is a conceptual block diagram depicting a radar system including coupler circuitry and a single pole double throw (SPDT) switch, in accordance with some examples of this disclosure.

FIG. 4 is a conceptual block diagram depicting a radar system 400 including coupler circuitry 420 and a single pole double throw (SPDT) switch 436, in accordance with some examples of this disclosure. Coupler circuitry 420 and SPDT switch 436 may be configured to cause the multiplied signals in the transmitter chain and the receiver chain to have approximately equal frequencies. SPDT switch 436 may be configured to selectively deliver an amplified signal from amplifier 421B or an amplified signal from amplifier 421A to mixer 432.

Radar system 400 may be configured to operate as a pulse radar with an FMCW mode. Coupler circuitry 420 may be configured to couple or match the transmitter signal received from BPF 418A to the signal received by the mixer. SPDT switch 436 may be configured to switch between coupler circuitry 420 and amplifier 421B in the receiver chain. Therefore, radar system 400 may use the same frequency chirp from the transmitter to be the local oscillator for the receiver because coupler circuitry 420 matches the frequencies in the two chains. Coupler circuitry 420 and SPDT switch 436 may be configured to allow radar system 400 to operate in FMCW mode. In addition, DDS circuitry 408A and/or 408B may include a variable clock for transmission carrier signals and receiver local oscillator/intermediate frequency offsets.

In some examples, a radar system may include a quadrature up converter configured to generate a converted signal based on an input signal from a DDS. The converted signal may have a higher frequency than the input signal received by the quadrature up converter from the DDS.

Figure 5:
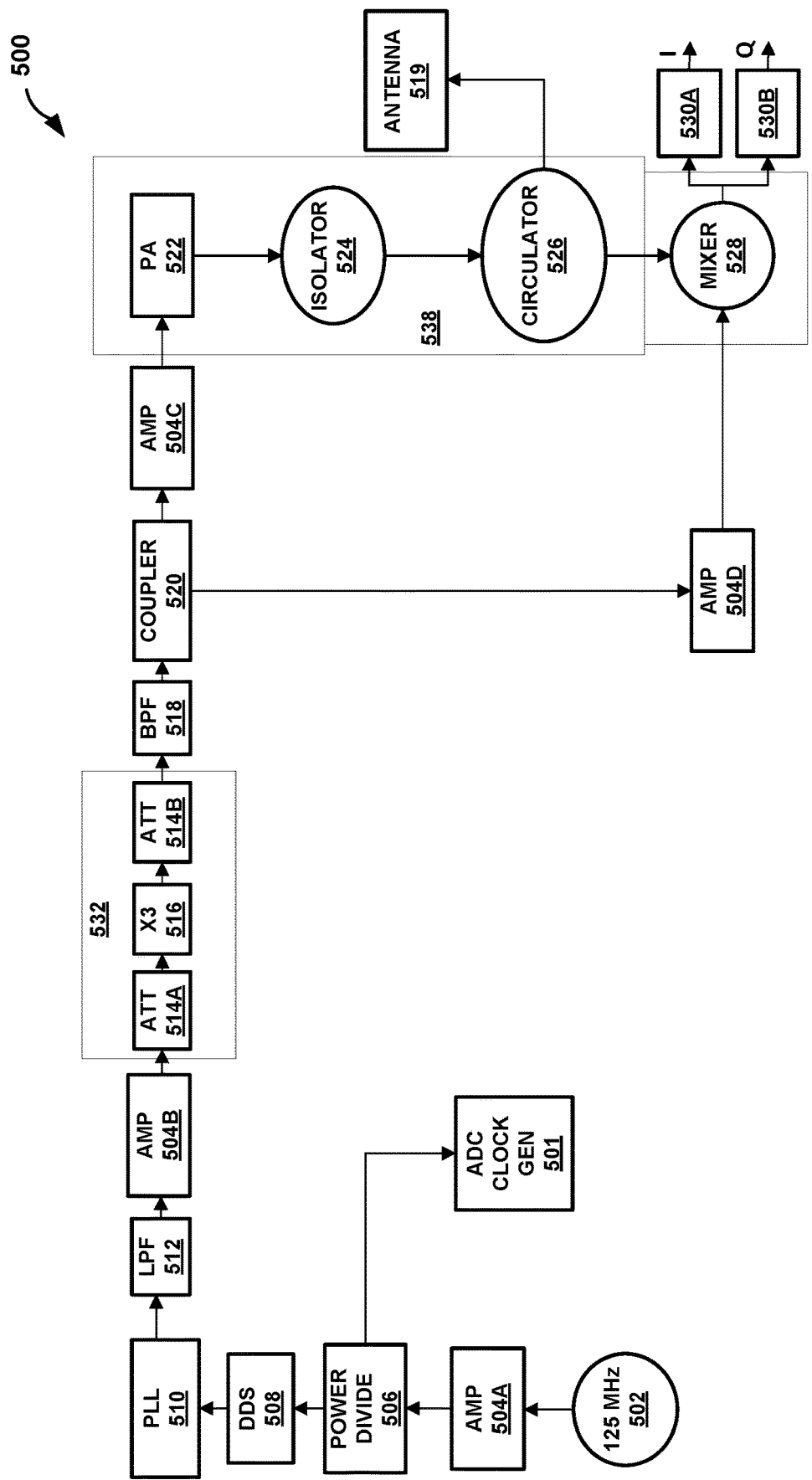
FIG. 5 is a conceptual block diagram depicting a radar system including a quadrature up-converter, in accordance with some examples of this disclosure.

FIG. 5 is a conceptual block diagram depicting a radar system 500 including a single synthesizer and coupler circuitry 520, in accordance with some examples of this disclosure. Coupler circuitry 520 may be configured to deliver a multiplied signal from frequency multiplier circuitry to transmitter circuitry and receiver circuitry. Radar system 500 may be configured to operate as an FMCW radar. A separate offset receiver mixer or a separate receiver local oscillator may not be necessary. Radar system 500 may be configured to use a sample of the transmitted signal on the receiver side.

Radar system 500 may be relatively inexpensive and relatively simple compared to other marine radars and aviation radar system. Radar system 500 may be configured to generate a waveform, instead of just generating a fixed tone. The 9954 DDS may be configured to drive the clock signal of the 4355 PLL so that the waveform can be generated even though the PLL operates as if it is sitting still. Radar system 500 may be configured to generate the waveform and turn it on and off.

In some examples, the clock 501 may operate at 125 MHz or 128 MHz. The cutoff frequency of LPF 512 may be slightly higher than the desired frequency of the PLL 510. In some examples, the desired frequency of the PLL 510 may be 3.1 GHz. Radar system 500 may be configured to operate in FMCW mode.

Figure 6:
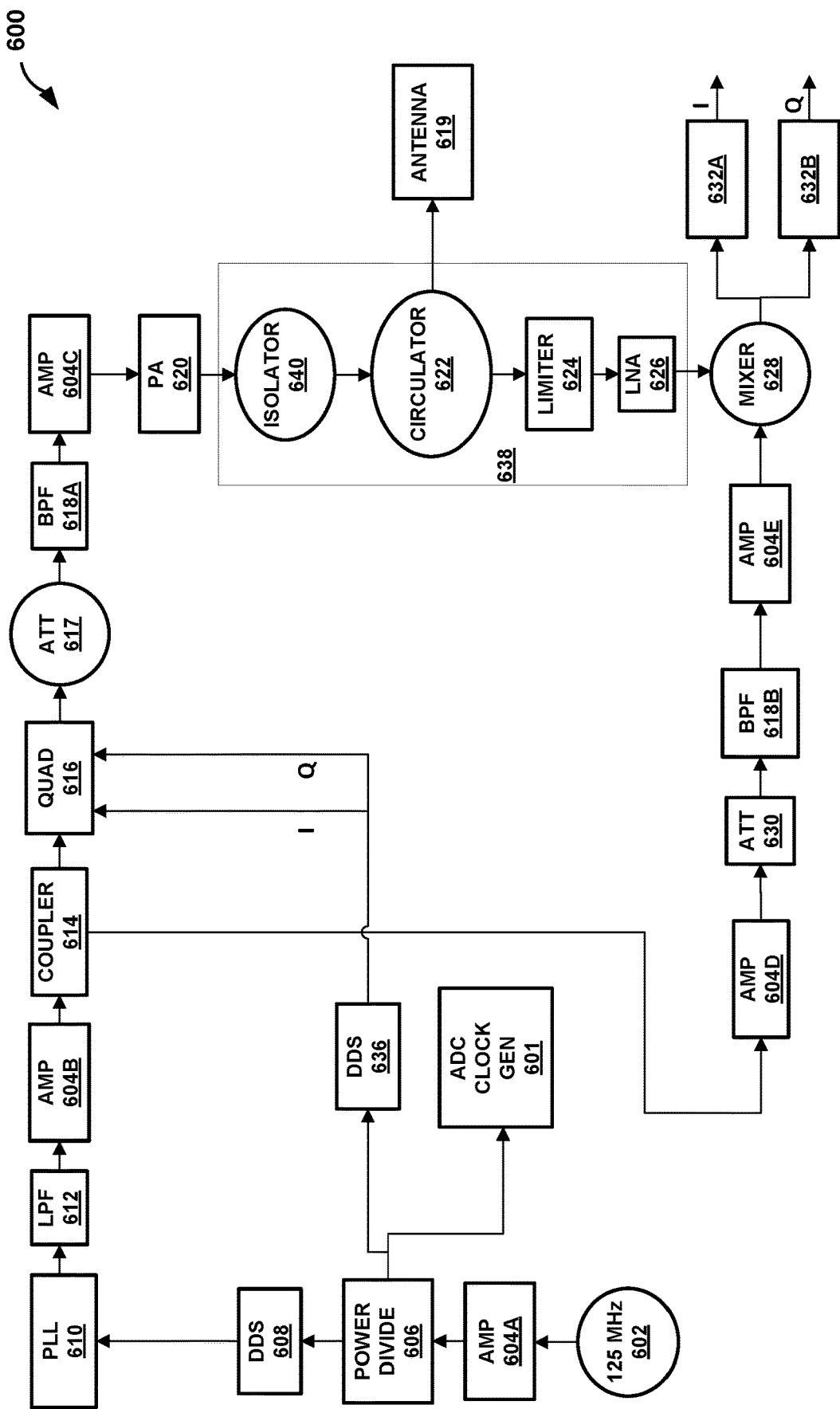
FIG. 6 is a conceptual block diagram depicting a radar system including a single synthesizer and coupler circuitry, in accordance with some examples of this disclosure.

FIG. 6 is a conceptual block diagram depicting a radar system 600 including a quadrature up-converter 616 (e.g., quadrature conversion circuitry), in accordance with some examples of this disclosure. PLL circuitry 610 may generate a signal to drive quadrature up-converter 616 to modulate the sinusoidal signals generated by the synthesizer. Quadrature up-converter 616 may be configured to modulate the phase of the sinusoidal signals. DDS circuitry 608 may include an AD9958 integrated circuit manufactured by Analog Devices, and quadrature up-converter 616 may include LTC5589 manufactured by Linear Technology. Radar system 600 may be configured to transmit signals from an antenna at 3.020 gigahertz and receive signals at the antenna at 3.0 gigahertz.

The output of PLL circuitry 610 may be up-converted by a quadrature up-converter. The output of quadrature up-converter 616 may be used as a final frequency, or the output may drive an amplifier chain. Quadrature up-converter 616 may be configured to generate a converted signal at a different frequency than an input signal, which may be a sinusoidal signal from power divider 606 and DDS circuitry 636.

A mixing process in a radar system may cause frequency translation. It may be desirable for an X-band or S-band radar system to generate a certain frequency as well as one or more frequency offsets. The radar system may generate a lower frequency to contain the information from the receiver when the return signal is received at the antenna. To generate an X-band frequency such as nine gigahertz, the radar system may start with a crystal oscillator and apply various forms of frequency multiplication, frequency translation, and/or frequency mixing. Two signals combined in a mixer may result in a sum of the frequencies and a difference of the frequencies. The sum of the frequencies may be useful for high-frequency applications. If the difference of the frequencies is close to the sum of the frequencies, it may be difficult to build a filter to remove the difference signal.

The quadrature up-converter may be known as a single sideband mixer and may be configured to generate only a sum of the frequencies. The quadrature up-converter may be configured to generate a real version of the input signal and an imaginary version of the input signal (e.g., the signal shifted ninety degrees). For example, a DDS may be configured to adjust the phase of an input signal to ninety degrees. A quadrature up-converter may be a special form of a mixer that uses a reference signal with two inputs (e.g., at zero degrees and ninety degrees). The quadrature up-converter may be configured to translate up the incoming signal when the two input signals are mixed to generate a summed signal. The I-Q angle of the quadrature up-converter may be adjustable to cancel the difference frequency, leaving only one sideband signal.

DDS circuitry may generate two independent output signals (labeled I and Q in FIG. 6). The phase of the I and Q signals may be adjusted in small increments such as tenths or hundredths of one degree. The phase and the amplitude of the I and Q signals may be adjusted in small increments to optimize the cancellation of the undesired sideband. The quadrature up converter may be further optimized with a DDS as a reference oscillator.

DDS circuitry may impress modulation such as linear FM or nonlinear FM onto a carrier signal to generate a waveform. The rest of the DDS is still fixed frequency and the modulation is impressed with a correlator. The performance of correlator may be good at S-band frequencies around three gigahertz. However, it may be difficult to use a correlator at X-band frequencies around nine gigahertz. The radar systems of FIGS. 2-7 and 10-13 may be similar, such that construction of one radar system may include most or all of the same components as another radar system of FIGS. 2-7 and 10-13.

Figure 7:
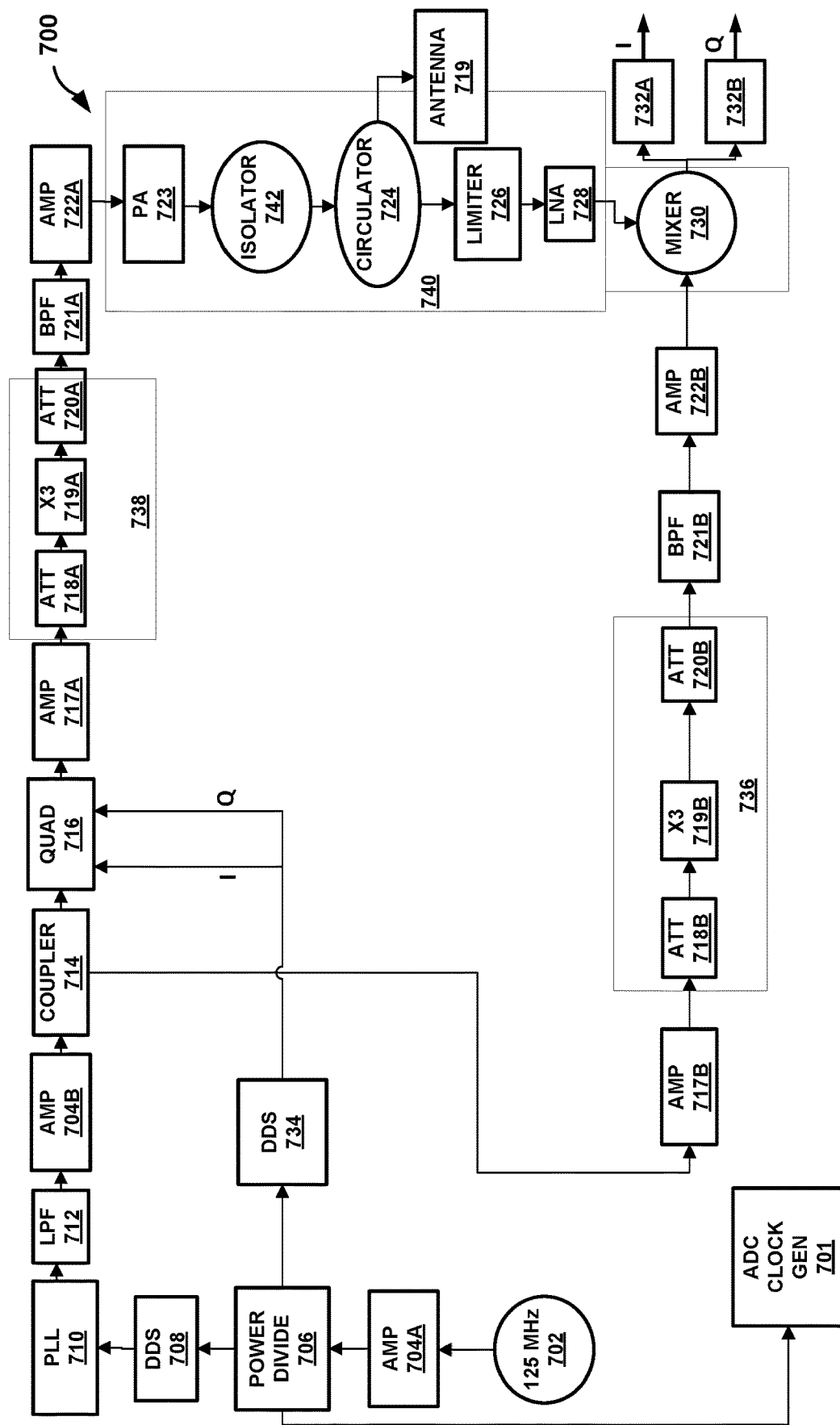
FIG. 7 is a conceptual block diagram depicting a radar system including a single synthesizer and two frequency multiplier circuits, in accordance with some examples of this disclosure.

FIG. 7 is a conceptual block diagram depicting a radar system 700 including a single synthesizer and two frequency multiplier circuits, in accordance with some examples of this disclosure. Radar system 700 may include DDS circuitry 708 and quadrature up-converter 716 for modulating signals in the transmitter chain. Radar system 700 may include DDS transmission frequency hopping, linear FM, and nonlinear FM. Radar system 700 may be configured to operate in FMCW mode.

Figure 8:
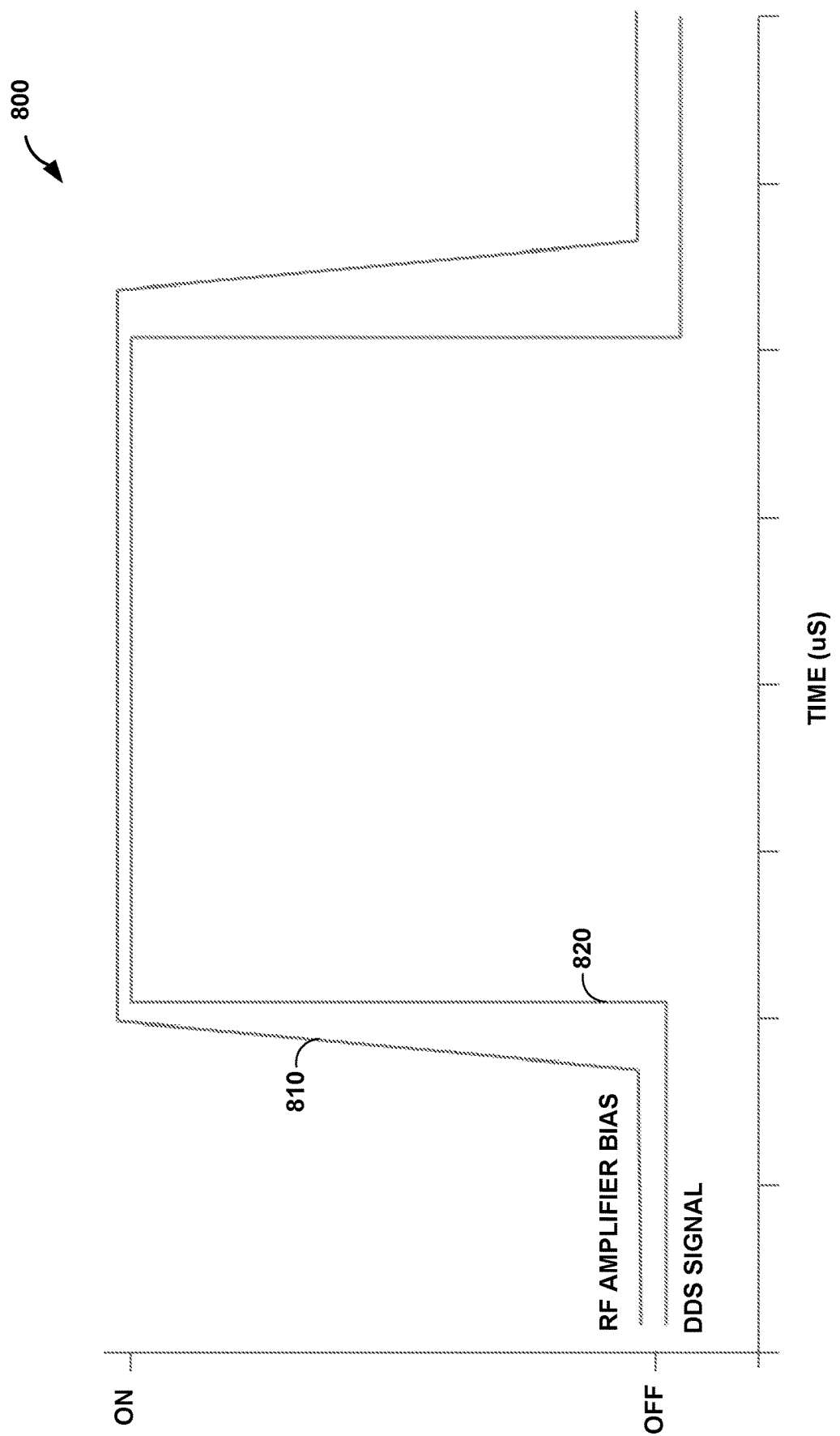
FIG. 8 is a graph of RF amplifier and DDS circuitry on times, in accordance with some examples of this disclosure.

FIG. 8 is a graph 800 of RF amplifier and DDS circuitry on-times, in accordance with some examples of this disclosure. Graph may be applicable to any system of this disclosure, particularly systems 600 and 700. The RF amplifier on-time 810 may begin before, and end after, the DDS circuitry on-time 820. DDS on-time 820 may be the time period during which the DDS generates an output signal or pulse (i.e., a DDS signal). At the far left-hand side of graph 800, the DDS may be turned off with no output signal. The PLL circuitry may also be turned off at the same time as the RF amplifier (e.g., the chirp). During the on-period of the DDS, the DDS may be generated a waveform. The frequency of the DDS signal may be in the range of three hundred and eighty megahertz and the may be more than one period of the DDS signal in the on-period shown in FIG. 8. Inside the envelope of the on-period of the square wave of graph 800, there may be a sinusoidal wave of approximately 128 or 129 megahertz.

The RF amplifier circuitry may require relatively high power and turn on slowly, so the slope of the rising edge of the RF amplifier on-time 810 is less vertical than the slope of the rising edge of DDS circuitry on-time 820. The RF amplifier circuitry may draw an electrical current of more than one amperes. There may be ringing or instability at the top of the rising edge of RF amplifier on-time 810. Therefore, it may be desirable to turn on the RF bias and wait for the RF bias to stabilize after stabilization of the RF bias. Turning on and off the RF bias instead of turning on and off the envelope of the output signal (e.g., radar signal or transmitted signal) may reduce the distortion, lag times, sidebands, spectrum outside the desired band, and/or droop. The modulator may control RF amplifier on-time 810. DDS on-time 820 may be much more accurate and quicker than RF amplifier on-time 810 because a DDS may transition from on to off almost instantaneously.

In some examples, the DDS may be configured to turn on and off the RF amplifier by creating the envelope for the RF amplifier. The on-times 810 and 820 may be important to the performance of a radar system in terms of the target characteristics in the receiver and on the display. In some examples, the reflections from objects and particles may be corrupted because of improper on-times. For example, a point source sensed by the radar system may appear extended or exhibit unusual characteristics. In some examples, the transmitter may generate spectrum that lies outside the legal band (e.g., spurious radiation).

Thus, increasing the frequency of the signal by three-fold may allow the radar device to use S-band frequencies without the increase in frequency or X-band frequencies with the increase in frequency. The efficiencies of using the same components for both radar devices, with the exception of the three-fold frequency multiplier, allows a manufacturer to reduce fabrication costs. The same DDS circuitry may be used in both S-band and X-band applications for weather radar, aviation radar, and/or marine radar. The techniques of this disclosure may be implemented as a low-cost X-band aviation radar or as a chirp generator of a Digital Antenna Phased Array. Two DDS circuits may be used in a radar device such that the radar device includes the capability for Frequency Modulated Continues Wave, Non-Linear FM, Linear FM, or pulsed radar. However, the system is not limited to these modulation modes. New modes may be implemented by developing different DDS waveforms and receiver algorithms to match.

Using common semiconductor parts may allow common assembly and test processes, even for different radar devices. Using the techniques of this disclosure, dedicated test equipment for each application and product may no longer be necessary. In some examples, one circuit card may support multiple applications. The card may either be implemented with blank spots or "Do Not Populate" areas. These blank or DNP spots can be populated with parts for alternate applications. Or the common core could be on a circuit card with connectors and with different circuit cards interconnected.

Figure 9:
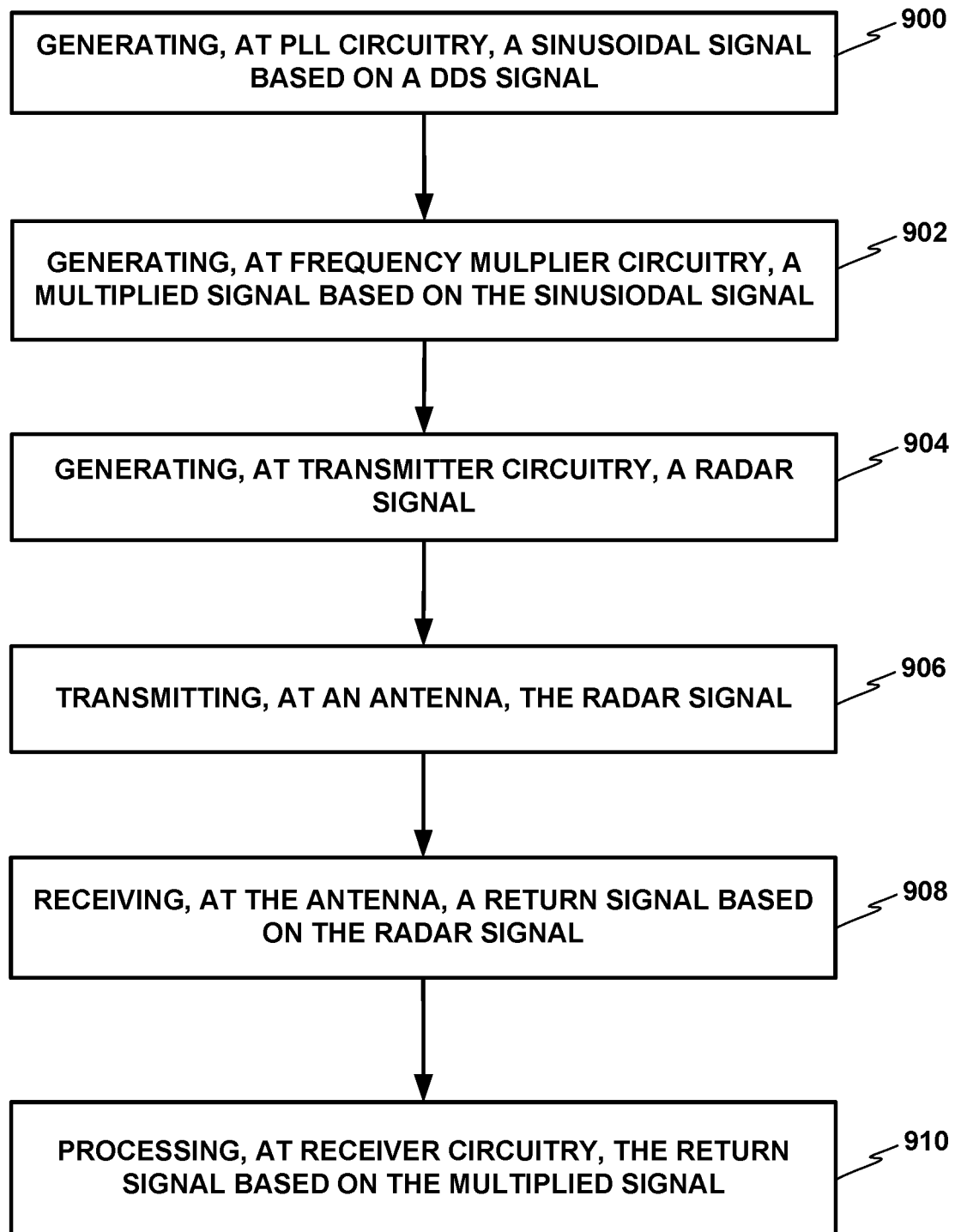
FIG. 9 shows a flowchart for example techniques for operating a radar system, in accordance with some examples of this disclosure.

FIG. 9 shows a flowchart for example techniques for operating a radar system, in accordance with some examples of this disclosure. The techniques are described with reference to radar system 500 of FIG. 5, although other components, such as radar systems 100, 200, 300, 400, 600, 700, 1000, 1100, 1200, and 1300, may perform similar techniques.

The techniques of FIG. 9 include PLL circuitry 510 generating a sinusoidal signal based on a DDS signal generated by DDS circuitry 508 (900). In some examples, the DDS circuitry may be configured to adjust the clock of the PLL circuitry, causing the PLL circuitry to generate sinusoidal signal. The techniques of FIG. 9 further include generating, at frequency multiplier circuitry 532, a multiplied signal based on the sinusoidal signal from PLL circuitry 510 (902). LPF 512 and amplifier 504B may be configured to filter and amplify the sinusoidal signal before delivering the signal to frequency multiplier circuitry 532. The techniques of FIG. 9 further include generating, at transmitter circuitry that may include PA 522, isolator 524, and circulator 526, a radar signal based on the multiplied signal generated by frequency multiplier circuitry 532 (904). The techniques of FIG. 9 further include transmitting, at antenna 519, the radar signal (906).

The techniques of FIG. 9 further include receiving, at antenna 519, the return signal based on the radar signal (908). The techniques of FIG. 9 further include processing, at receiver circuitry that may include circulator 526 and mixer 528, the return signal based on the multiplied signal generated by frequency multiplier circuitry 532 (910). The receiver circuitry may be configured to receive the multiplied signal through coupler circuitry 520 and amplifier 504D. Coupler circuitry 520 may be configured to deliver the same multiplied signal to the receiver circuitry and transmitter circuitry through amplifiers 504C and 504D to promote coherency in radar system 500.

In general, a radar system of this disclosure may be configured to modulate the sinusoidal signal that is generated by PLL circuitry. The radar system may be configured to produce a frequency offset for the receiver circuitry to generate a standard intermediate frequency (IF). This radar system may include a super-heterodyne receiver structure.

Another radar system may include an upconverter circuit configured to directly upconvert a DDS signal. The DDS in the other radar system may not connected to a PLL. The DDS signal of the other radar system may be directly upconverted instead of providing an input to the clock port of a fractional-N or integer-N synthesizer. A fractional-N synthesizer may operate as a local oscillator configured to upconvert a signal to three gigahertz. Some other radar systems may include many steps of up-conversion, many steps of filtering and mixers, and/or sideband removal. These other radar systems may function properly, but the other radar systems may have higher costs and complexity. In contrast, a radar system of this disclosure may include a DDS directly driving a clock input to an integer-N synthesizer PLL. The radar system may also include a VCO integrated into the chip for the DDS or the PLL. An integrated VCO may experience increased phase noise, as compared to a discrete VCO. However, an integrated VCO may take up less space and cost less, as compared to a discrete VCO.

FIGS. 10-13 are conceptual block diagrams depicting radar systems 1000, 1100, 1200, and 1300 including a single synthesizer and a quadrature up-converter, in accordance with some examples of this disclosure. Radar systems 1000 and 1100 may include a "common core" that includes a synthesizer, coupler circuitry, and quadrature upconverter circuitry. An advantage of radar systems 1000 and 1100 may be that the circuitry of the common core may result in lower costs because a manufacturer can purchase high volumes of the common-core components at discounted prices. The manufacturer may then use the common-core components to produce two separate radar systems. In contrast, another manufacturer may use different components for each separate radar system or attempt to build a radar system that operates across several bands. The other manufacturer may end up with a higher price for similar or worse performance, as compared to radar systems 1000 and 1100.

Radar systems 1000 and 1100 may include DDS transmission frequency hopping, linear FM, and nonlinear FM. Radar systems 1000 and 1100 may also be configured to operate in FMCW mode. Radar system 1100 may be configured to transmit radar signals at 3.020 gigahertz and receive return signals at three gigahertz. Radar system 1300 may be configured to have excellent suppression of carrier signals and sidebands because of quadrature upconverter 1318.

The techniques of this disclosure may be implemented in a device or article of manufacture including a computer-readable storage medium. The term "processing circuitry," as used herein may refer to any of the foregoing structure or any other structure suitable for processing program code and/or data or otherwise implementing the techniques described herein. Elements of processing circuitry may be implemented in any of a variety of types of solid state circuit elements, such as CPUs, CPU cores, GPUs, digital signal processors (DSPs), application-specific integrated circuits (ASICs), a mixed-signal integrated circuits, field programmable gate arrays (FPGAs), microcontrollers, programmable logic controllers (PLCs), programmable logic device (PLDs), complex PLDs (CPLDs), a system on a chip (SoC), any subsection of any of the above, an interconnected or distributed combination of any of the above, or any other integrated or discrete logic circuitry, or any other type of component or one or more components capable of being configured in accordance with any of the examples disclosed herein.

The radar systems of FIGS. 1-7 and 10-13 may include one or more memory devices that include any volatile or non-volatile media, such as a RAM, ROM, non-volatile RAM (NVRAM), electrically erasable programmable ROM (EEPROM), flash memory, and the like. The one or more memory devices may store computer readable instructions that, when executed by processing circuitry, cause the processing circuitry to implement the techniques attributed herein to processing circuitry.

Elements of the processing circuitry and/or the transceiver may be programmed with various forms of software. The processing circuitry and/or the transceiver may be implemented at least in part as, or include, one or more executable applications, application modules, libraries, classes, methods, objects, routines, subroutines, firmware, and/or embedded code, for example. Elements of the processing circuitry and/or the transceiver as in any of the examples herein may be implemented as a device, a system, an apparatus, and may embody or implement a method of receiving surveillance signals and predicting future vehicle maneuvers.

The techniques of this disclosure may be implemented in a wide variety of computing devices. Any components, modules or units have been described to emphasize functional aspects and does not necessarily require realization by different hardware units. The techniques described herein may be implemented in hardware, software, firmware, or any combination thereof. Any features described as modules, units or components may be implemented together in an integrated logic device or separately as discrete but interoperable logic devices. In some cases, various features may be implemented as an integrated circuit device, such as an integrated circuit chip or chipset.

A "vehicle" may be an aircraft, a land vehicle such as an automobile, or a water vehicle such as a ship or a submarine. An "aircraft" as described and claimed herein may include any fixed-wing or rotary-wing aircraft, airship (e.g., dirigible or blimp buoyed by helium or other lighter-than-air gas), suborbital spaceplane, spacecraft, expendable or reusable launch vehicle or launch vehicle stage, or other type of flying device. An "aircraft" as described and claimed herein may include any crewed or uncrewed craft (e.g., uncrewed aerial vehicle (UAV), flying robot, or automated cargo or parcel delivery drone or other craft).

The following numbered examples demonstrate one or more aspects of the disclosure.

Example 1

A radar system includes first DDS circuitry and first PLL circuitry configured to generate a first sinusoidal signal based on a first DDS signal generated by the first DDS circuitry. The radar system also includes transmitter circuitry configured to generate a radar signal based on the first sinusoidal signal, one or more antennas configured to transmit the radar signal and receive a return signal based on the radar signal, and second DDS circuitry. The radar system further includes second PLL circuitry configured to generate a second sinusoidal signal based on a second DDS signal generated by the second DDS circuitry and receiver circuitry configured to process the return signal based on the second sinusoidal signal.

Example 1 may correspond to any radar system of FIGS. 2-4. The first DDS circuitry and the second DDS circuitry may correspond to DDS circuitry 208A and 208B, 308A and 308B, or 408A and 408B. The first PLL circuitry and the second PLL circuitry may correspond to PLL circuitry 210A and 210B, 310A and 310B, or 410A and 410B. The transmitter circuitry may correspond to PA's 216, 318, or 422. The one or more antennas may correspond to antennas 219, 319, or 419. The receiver circuitry may correspond to mixers 224, 328, or 432, and in some examples, amplifiers 215B, 317B, or 421B.

Example 2

The radar system of example 1, wherein the first PLL circuitry includes a fixed-frequency PLL or the second PLL circuitry includes a fixed-frequency PLL.

Example 3

The radar system of examples 1-2 or any combination thereof, further including an oscillator configured to generate a clock signal. The oscillator may correspond to clock generator circuitry 201 and 202, 301 and 302, or 401 and 402.

Example 4

The radar system of examples 1-3 or any combination thereof, wherein the first DDS circuitry is configured to generate the first DDS signal based on the clock signal.

Example 5

The radar system of examples 1-4 or any combination thereof, wherein the second DDS circuitry is configured to generate the second DDS signal based on the clock signal.

Example 6

The radar system of examples 1-5 or any combination thereof, further including first BPF circuitry configured to generate a first band-filtered signal based on the first sinusoidal signal. The first BPF circuitry may correspond to BPF 214A, 316A, or 418A.

Example 7

The radar system of examples 1-6 or any combination thereof, wherein the transmitter circuitry configured to generate the radar signal based on the first band-filtered signal.

Example 8

The radar system of examples 1-7 or any combination thereof, further including second BPF circuitry configured to generate a second band-filtered signal based on the second sinusoidal signal. The second BPF circuitry may correspond to BPF 214B, 316B, or 418B.

Example 9

The radar system of examples 1-8 or any combination thereof, wherein the receiver circuitry configured to process the return signal based on the second band-filtered signal.

Example 10

The radar system of examples 1-9 or any combination thereof, further including first LPF circuitry configured to generate a first low-filtered signal based on the first sinusoidal signal. The first LPF circuitry may correspond to LPF 212A, 312A, or 412A.

Example 11

The radar system of examples 1-10 or any combination thereof, wherein the transmitter circuitry is configured to generate the radar signal based on the first low-filtered signal.

Example 12

The radar system of examples 1-11 or any combination thereof, further including second LPF circuitry configured to generate a second low-filtered signal based on the second sinusoidal signal. The second BPF circuitry may correspond to LPF 212B, 312B, or 412B.

Example 13

The radar system of examples 1-12 or any combination thereof, wherein the receiver circuitry configured to process the return signal based on the second low-filtered signal.

Example 14

The radar system of examples 1-13 or any combination thereof, wherein the transmitter circuitry is configured to generate the radar signal in an FMCW mode and in a pulsed radar mode.

Example 15

The radar system of examples 1-14 or any combination thereof, wherein the receiver circuitry is configured to generate a processed signal based on the return signal and based on the second sinusoidal signal.

Example 16

The radar system of examples 1-15 or any combination thereof, further including processing circuitry configured to determine existence of a target based on the processed signal. The processing circuitry may correspond to processing circuitry 226A and 226B, 330A and 330B, or 434A and 434B.

Example 17

The radar system of examples 1-16 or any combination thereof, further including an output device configured to output a presentation based on the determination of the processing circuitry as to the existence of a target.

Example 18

The radar system of examples 1-17 or any combination thereof, further including first frequency multiplier circuitry configured to generate a first multiplied signal based on the first sinusoidal signal. The first frequency multiplier circuitry may correspond to frequency multiplier circuitry 332 or 440.

Example 19

The radar system of examples 1-18 or any combination thereof, wherein the first frequency multiplier circuitry is configured to generate a first multiplied signal based on the first low-filtered signal.

Example 20

The radar system of examples 1-19 or any combination thereof, wherein the transmitter circuitry is configured to generate the radar signal based on the first multiplied signal.

Example 21

The radar system of examples 1-20 or any combination thereof, wherein the first BPF circuitry is configured to generate the first band-filtered signal based on the first multiplied signal.

Example 22

The radar system of examples 1-21 or any combination thereof, further including second frequency multiplier circuitry configured to generate a second multiplied signal based on the second sinusoidal signal. The second frequency multiplier circuitry may correspond to frequency multiplier circuitry 334 or 438.

Example 23

The radar system of examples 1-22 or any combination thereof, wherein the second frequency multiplier circuitry is configured to generate a second multiplied signal based on the second low-filtered signal.

Example 24

The radar system of examples 1-23 or any combination thereof, wherein the receiver circuitry is configured to process the return signal based on the second multiplied signal.

Example 25

The radar system of examples 1-24 or any combination thereof, wherein the second BPF circuitry is configured to generate the second band-filtered signal based on the second multiplied signal.

Example 26

The radar system of examples 1-25 or any combination thereof, further including coupler circuitry configured to match the second band-filtered signal to the first band-filtered signal. The coupler circuitry may correspond to coupler circuitry 420.

Example 27

The radar system of examples 1-26 or any combination thereof, further including coupler circuitry configured to match the second multiplied signal to the first multiplied signal.

Example 28

A radar system includes DDS circuitry and PLL circuitry configured to generate a sinusoidal signal based on a DDS signal generated by the DDS circuitry. The radar system also includes quadrature conversion circuitry configured to generate a converted signal based on the sinusoidal signal. The radar system further includes transmitter circuitry configured to generate a radar signal based on the converted signal. The radar system includes one or more antennas configured to transmit the radar signal and receive a return signal based on the radar signal and receiver circuitry configured to process the return signal based on the sinusoidal signal.

Example 28 may correspond to any radar system of FIGS. 6, 7, and 10-13. The DDS circuitry may correspond to DDS circuitry 608, 708, 1008, 1108, 1208, or 1308. The PLL circuitry may correspond to PLL circuitry 610, 710, 1010, 1110, 1210, or 1310. The quadrature conversion circuitry may correspond to quadrature conversion circuitry 616, 716, 1018, 1116, 1220A, or 1318. The transmitter circuitry may correspond to PA's 620, 723, 1026A, 1026B, 1120, 1222, or 1320 and in some examples, amplifiers 604C, 722A. 1025A, 1119A, 1204D, or 1304D. The one or more antennas may correspond to antennas 619, 719. 1019, 1119, 1219, or 1319. The receiver circuitry may correspond to mixers 628, 730, 1034, 1128, 1230, or 1328, and in some examples, amplifiers 604E, 722B, 1025B, 1119B, 1204E, or 1304E.

Radar systems 600, 700, 1000, 1100, 1200, and 1300 may include quadrature converter circuitry in the transmit chain downstream from coupler circuitry. Radar systems 600 and 1100 may include quadrature converter circuitry upstream from BPF circuitry and an amplifier. Radar systems 700 and 1000 may include quadrature converter circuitry upstream from frequency multiplier circuitry, BPF circuitry, and amplifiers. Radar systems 1200 and 1300 may include quadrature converter circuitry upstream from an amplifier.

Example 29

The radar system of example 28, further including coupler circuitry configured to deliver the sinusoidal signal to the quadrature conversion circuitry and the receiver circuitry. The coupler circuitry may correspond to coupler circuitry 614, 714, 1016, 1114, 1218, or 1316.

Example 30

The radar system of examples 28-29 or any combination thereof, wherein the PLL circuitry is a fixed-frequency PLL.

Example 31

The radar system of examples 28-30 or any combination thereof, further including an oscillator configured to generate a clock signal. The oscillator may correspond to clock generator circuitry 601 and 602, 701 and 702, 1001 and 1002, 1101 and 1102, 1201 and 1202, or 1301 and 1302.

Example 32

The radar system of examples 28-31 or any combination thereof, wherein the DDS circuitry is configured to generate the DDS signal based on the clock signal.

Example 33

The radar system of examples 28-32 or any combination thereof, wherein the receiver circuitry configured to process the return signal based on the return signal and the sinusoidal signal.

Example 34

The radar system of examples 28-33 or any combination thereof, further including processing circuitry configured to determine existence of a target based on the processed signal. The processing circuitry may correspond to processing circuitry 632A and 632B, 732A and 732B, 1036A and 1036B, 1132A and 1132B, 1232A and 1232B, 1330A and 1330B.

Example 35

The radar system of examples 28-34 or any combination thereof, further including an output device configured to output a presentation based on the determination of the processing circuitry as to the existence of a target.

Example 36

The radar system of examples 28-35 or any combination thereof, further including first frequency multiplier circuitry configured to generate a first multiplied signal based on the converted signal. The first frequency multiplier circuitry may correspond to frequency multiplier circuitry 738, 1040, or 1240.

Example 37

The radar system of examples 28-36 or any combination thereof, wherein the transmitter circuitry is configured to generate the radar signal based on the first multiplied signal.

Example 38

The radar system of examples 28-37 or any combination thereof, further including second frequency multiplier circuitry configured to generate a second multiplied signal based on the sinusoidal signal. The second frequency multiplier circuitry may correspond to frequency multiplier circuitry 736. 1042, or 1240.

Example 39

The radar system of examples 28-38 or any combination thereof, wherein the receiver circuitry is configured to process the return signal based on the second multiplied signal.

Example 40

A radar system includes DDS circuitry and PLL circuitry configured to generate a sinusoidal signal based on a DDS signal generated by the DDS circuitry. The radar system also includes frequency multiplier circuitry configured to generate a multiplied signal based on the sinusoidal signal. The radar system further includes transmitter circuitry configured to generate a radar signal based on the multiplied signal. The radar system includes one or more antennas configured to transmit the radar signal and receive a return signal based on the radar signal and receiver circuitry configured to process the return signal based on the multiplied signal.

Example 40 may correspond to any radar system of FIGS. 3-5, 7, 10, and 12. The DDS circuitry may correspond to DDS circuitry 308, 408, 508, 708, 1008, or 1208. The PLL circuitry may correspond to PLL circuitry 310, 410, 510, 710, 1010, or 1210. The frequency multiplier circuitry may correspond to frequency multiplier circuitry 332, 334, 438, 440, 532, 736, 738, 1040, 1042, or 1240. The transmitter circuitry may correspond to PA's 318, 422, 522, 723, 1026A, 1026B, or 1222 and in some examples, amplifiers 317A, 421A, 504C, 722A. 1025A, or 1204D. The one or more antennas may correspond to antennas 319, 419, 519, 719, 1019, or 1219. The receiver circuitry may correspond to mixers 328, 432, 528, 730, 1034, or 1230, and in some examples, amplifiers 317B, 421B, 504D, 604E, 722B, 1025B, or 1204E.

In some examples, the transmit chain and the receive chain may each include frequency multiplier circuitry. In radar systems 300 and 400, for example, the transmit chain and the receive chain each include separate DDS circuitry, separate PLL circuitry, and frequency multiplier circuitry. Radar system 400 may include coupler circuitry 420 and SPDT switch 436 to provide increased coherency by coupling the band-filtered signals in the transmit chain and the receive chain. Radar systems 700 and 1000 may include coupler circuitry upstream from the frequency multiplier circuitry, such that the system may include only one synthesizer chain. Radar system 1200 may include coupler circuitry downstream from the frequency multiplier circuitry, such that the system may include only one synthesizer chain and only one frequency multiplier circuitry.

Example 41

The radar system of example 40, further including coupler circuitry configured to deliver the sinusoidal signal to the transmitter circuitry and the receiver circuitry. The coupler circuitry may correspond to coupler circuitry 420, 520, 714, 1016, or 1218.

Example 42

The radar system of examples 40-41 or any combination thereof, wherein the PLL circuitry is a fixed-frequency PLL.

Example 43

The radar system of examples 40-42 or any combination thereof, further including an oscillator configured to generate a clock signal. The oscillator may correspond to clock generator circuitry 301 and 302, 401 and 402, 501 and 502, 701 and 702, 1001 and 1002, or 1201 and 1202.

Example 44

The radar system of examples 40-43 or any combination thereof, wherein the DDS circuitry is configured to generate the DDS signal based on the clock signal.

Example 45

The radar system of examples 40-44 or any combination thereof, further including BPF circuitry configured to generate a first filtered signal based on the multiplied signal. The BPF circuitry may correspond to BPF 316A, 316B, 418A, 418B, 518, 721A, 721B, 1024A, 1024B, or 1216.

Example 46

The radar system of examples 40-45 or any combination thereof, wherein the coupler circuitry is configured to deliver the first filtered signal to the transmitter circuitry and the receiver circuitry.

Example 47

The radar system of examples 40-46 or any combination thereof, wherein the transmitter circuitry configured to generate the radar signal based on the first filtered signal.

Example 48

The radar system of examples 40-47 or any combination thereof, wherein the receiver circuitry configured to process the return signal based on the first filtered signal.

Example 49

The radar system of examples 40-48 or any combination thereof, further including LPF circuitry configured to generate a second filtered signal based on the sinusoidal signal. The first LPF circuitry may correspond to LPF 312A, 312B, 412A, 412B, 512, 712, 1012, or 1210.

Example 50

The radar system of examples 40-49 or any combination thereof, wherein the frequency multiplier circuitry is configured to generate the multiplied signal based on the second filtered signal.

Example 51

The radar system of examples 40-50 or any combination thereof, wherein the transmitter circuitry is configured to generate the radar signal in an FMCW mode.

Example 52

The radar system of examples 40-51 or any combination thereof, wherein the receiver circuitry is configured to generate a processed signal based on the return signal and the multiplied signal.

Example 53

The radar system of examples 40-52 or any combination thereof, further including processing circuitry configured to determine existence of a target based on the processed signal. The processing circuitry may correspond to processing circuitry 330A and 330B, or 434A and 434B, 530A and 530B, 732A and 732B, 1036A and 1036B, or 1232A and 1232B.

Example 54

The radar system of examples 40-53 or any combination thereof, further including an output device configured to output a presentation based on the determination of the processing circuitry as to the existence of a target.

Various illustrative aspects of the disclosure are described above. These and other aspects are within the scope of the following claims.

What is claimed is:

1. A radar system comprising:
   first direct digital synthesizer (DDS) circuitry;
   first phase-locked loop (PLL) circuitry configured to generate a first sinusoidal signal based on a first DDS signal generated by the first DDS circuitry;
   transmitter circuitry configured to generate a radar signal based on the first sinusoidal signal;
   one or more antennas configured to transmit the radar signal and receive a return signal based on the radar signal;
   second DDS circuitry;
   second PLL circuitry configured to generate a second sinusoidal signal based on a second DDS signal generated by the second DDS circuitry; and
   receiver circuitry configured to process the return signal based on the second sinusoidal signal.

2. The radar system of claim 1, wherein the first PLL circuitry or the second PLL circuitry includes fixed-frequency PLL circuitry.

3. The radar system of claim 1, further comprising an oscillator configured to generate a clock signal,
   wherein the first DDS circuitry is configured to generate the first DDS signal based on the clock signal, and
   wherein the second DDS circuitry is configured to generate the second DDS signal based on the clock signal.

4. The radar system of claim 1, further comprising:
   first band-pass filter circuitry configured to generate a first band-filtered signal based on the first sinusoidal signal, wherein the transmitter circuitry is configured to generate the radar signal based on the first band-filtered signal; and
   second band-pass filter circuitry configured to generate a second band-filtered signal based on the second sinusoidal signal, wherein the receiver circuitry is configured to process the return signal based on the second band-filtered signal.

5. The radar system of claim 4, further comprising coupler circuitry configured to match the second band-filtered signal to the first band-filtered signal.

6. The radar system of claim 1, further comprising:
   first low-pass filter circuitry configured to generate a first low-filtered signal based on the first sinusoidal signal, wherein the transmitter circuitry is configured to generate the radar signal based on the first low-filtered signal; and
   second low-pass filter circuitry configured to generate a second low-filtered signal based on the second sinusoidal signal, wherein the receiver circuitry is configured to process the return signal based on the second low-filtered signal.

7. The radar system of claim 1, wherein the transmitter circuitry is configured to generate the radar signal in a frequency modulation continuous wave mode and in a pulsed radar mode.

8. The radar system of claim 1, wherein the receiver circuitry is further configured to generate a processed signal based on the return signal and based on the second sinusoidal signal, wherein the radar system further comprises:
   processing circuitry configured to determine existence of a target based on the processed signal; and
   an output device configured to output a presentation based on the existence of the target.

9. The radar system of claim 1, further comprising:
   first frequency multiplier circuitry configured to generate a first multiplied signal based on the first sinusoidal signal, wherein the transmitter circuitry is configured to generate the radar signal based on the first multiplied signal; and
   second frequency multiplier circuitry configured to generate a second multiplied signal based on the second sinusoidal signal, wherein the receiver circuitry is configured to process the return signal based on the second multiplied signal.

10. The radar system of claim 9, further comprising coupler circuitry configured to match the second multiplied signal to the first multiplied signal.

11. The radar system of claim 1, further comprising:
    a transmit chain including the first DDS circuitry, the first PLL circuitry, and the transmitter circuitry; and
    a receive chain including the second DDS circuitry, the second PLL circuitry, and the receiver circuitry.

12. The radar system of claim 1,
    wherein the first PLL circuitry comprises a first integer-N synthesizer, and
    wherein the second PLL circuitry comprises a second integer-N synthesizer.

13. The radar system of claim 1, further comprising:
    a first voltage-controlled oscillator integrated into a first chip for the first PLL circuitry; and
    a second voltage-controlled oscillator integrated into a second chip for the second PLL circuitry.

14. A radar system comprising:
    a transmit chain including:
      first direct digital synthesizer (DDS) circuitry;
      first phase-locked loop (PLL) circuitry configured to generate a first sinusoidal signal based on a first DDS signal generated by the first DDS circuitry;
      first low-pass filter circuitry configured to generate a first low-filtered signal based on the first sinusoidal signal; and
      first frequency multiplier circuitry configured to generate a first multiplied signal based on the first low-filtered signal; and
      transmitter circuitry configured to generate a radar signal based on the first multiplied signal;
    one or more antennas configured to transmit the radar signal and receive a return signal based on the radar signal;
    a receive chain including:
      second DDS circuitry;
      second PLL circuitry configured to generate a second sinusoidal signal based on a second DDS signal generated by the second DDS circuitry;
      second low-pass filter circuitry configured to generate a second low-filtered signal based on the second sinusoidal signal; and second frequency multiplier circuitry configured to generate a second multiplied signal based on the second low-filtered signal; and receiver circuitry configured to process the return signal based on the second multiplied signal.

15. The radar system of claim 14, further comprising an oscillator configured to generate a clock signal,
wherein the first DDS circuitry is configured to generate the first DDS signal based on the clock signal, and
wherein the second DDS circuitry is configured to generate the second DDS signal based on the clock signal.

16. The radar system of claim 14, wherein the transmitter circuitry is configured to generate the radar signal in a continuous wave mode.

17. The radar system of claim 14, further comprising:
first band-pass filter circuitry configured to generate a first band-filtered signal based on the first multiplied signal, wherein the transmitter circuitry is configured to generate the radar signal based on the first band-filtered signal;
second band-pass filter circuitry configured to generate a second band-filtered signal based on the second multiplied signal, wherein the receiver circuitry is configured to process the return signal based on the second band-filtered signal; and
coupler circuitry configured to match the second band-filtered signal to the first band-filtered signal.

18. The radar system of claim 14,
wherein the first PLL circuitry comprises a first integer-N synthesizer, and
wherein the second PLL circuitry comprises a second integer-N synthesizer.

19. The radar system of claim 14,
a first voltage-controlled oscillator integrated into a first chip for the first PLL circuitry; and
a second voltage-controlled oscillator integrated into a second chip for the second PLL circuitry.

20. A radar system comprising:
a transmit chain including:
first direct digital synthesizer (DDS) circuitry;
first phase-locked loop (PLL) circuitry comprising a first integer-N synthesizer configured to generate a first sinusoidal signal based on a first DDS signal generated by the first DDS circuitry;
first low-pass filter circuitry configured to generate a first low-filtered signal based on the first sinusoidal signal;
first frequency multiplier circuitry configured to generate a first multiplied signal based on the first low-filtered signal;
first band-pass filter circuitry configured to generate a first band-filtered signal based on the first multiplied signal;
coupler circuitry configured to receive the first band-filtered signal; and
transmitter circuitry configured to generate a radar signal based on the first multiplied signal;
one or more antennas configured to transmit the radar signal and receive a return signal based on the radar signal; and
a receive chain including:
second DDS circuitry;
second PLL circuitry comprising a second integer-N synthesizer configured to generate a second sinusoidal signal based on a second DDS signal generated by the second DDS circuitry;
second low-pass filter circuitry configured to generate a second low-filtered signal based on the second sinusoidal signal;
second frequency multiplier circuitry configured to generate a second multiplied signal based on the second low-filtered signal;
second band-pass filter circuitry configured to generate a second band-filtered signal based on the second multiplied signal, wherein the coupler is configured to match the second band-filtered signal to the first band-filtered signal; and
receiver circuitry configured to process the return signal based on the second band-filtered signal.

* * * * *